US008558590B2

(12) United States Patent
Shibayama

(10) Patent No.: US 8,558,590 B2
(45) Date of Patent: Oct. 15, 2013

(54) REFERENCE VOLTAGE GENERATOR CIRCUIT AND IMAGE PROCESSING APPARATUS

(75) Inventor: Naoya Shibayama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/212,560

(22) Filed: Aug. 18, 2011

(65) Prior Publication Data

US 2012/0044012 A1 Feb. 23, 2012

(30) Foreign Application Priority Data

Aug. 20, 2010 (JP) ................................ 2010-185398

(51) Int. Cl.
*H03L 7/06* (2006.01)

(52) U.S. Cl.
USPC ............................ 327/148; 327/170; 327/157

(58) Field of Classification Search
USPC .......................................... 327/170, 148, 157
See application file for complete search history.

(56) References Cited

U.S. PATENT DOCUMENTS 4,792,705 A * 12/1988 Ouyang et al. ................ 327/376
5,144,156 A * 9/1992 Kawasaki ..................... 327/157
5,818,287 A * 10/1998 Chow ............................ 327/536
5,870,049 A 2/1999 Huang et al.
5,990,711 A * 11/1999 Sekimoto ...................... 327/112
6,008,632 A 12/1999 Sasaki
6,466,080 B2 10/2002 Kawai et al.
6,812,755 B2 * 11/2004 Yee et al. ...................... 327/157
6,826,248 B2 * 11/2004 Kushibe ........................ 375/376
6,853,253 B2 * 2/2005 Desortiaux ..................... 331/16
7,009,432 B2 * 3/2006 Beghein ........................ 327/157
7,339,409 B2 * 3/2008 Choi et al. .................... 327/170
7,495,485 B2 * 2/2009 Holuigue et al. ............. 327/157
7,724,066 B2 * 5/2010 Kamenick et al. ............ 327/427
8,183,913 B2 * 5/2012 Swei et al. .................... 327/537
2002/0044008 A1 4/2002 Kawai et al.
2004/0125067 A1 * 7/2004 Kim et al. ....................... 345/98
2008/0224679 A1 9/2008 Sahni et al.
2008/0252364 A1 10/2008 Chou
2009/0096493 A1 4/2009 Nagumo
2009/0121701 A1 5/2009 Kim et al.

FOREIGN PATENT DOCUMENTS

JP 2002-118451 4/2002
JP 2005-285019 10/2005
JP 2009-66921 4/2009

OTHER PUBLICATIONS

European Search Report issued by the European Patent Office on Jan. 6, 2012 in the corresponding European patent application.

* cited by examiner

*Primary Examiner* — Thomas J Hiltunen
(74) *Attorney, Agent, or Firm* — Staas & Halsey LLP

(57) ABSTRACT

A reference current generating circuit includes a generator that generates a reference voltage, a bias generator includes plural transistors of a different conductive types from each other and generates a first bias voltage and a second bias voltage, respectively, a first output transistor and a second output transistor of a different conductive type that outputs a current corresponds to a reference current when the first bias voltage or the second bias voltage is supplied thereto, an input-output unit that one terminal connected between the first output transistor and the second output terminal and the other terminal connected to a load, and supplies current from the first output transistor to the load or from the load to the second output transistor, and a switch that turns on/off the first and the second output transistors based on the output voltage of the input-output unit.

7 Claims, 15 Drawing Sheets

| | OUTPUT VOLTAGE | |
|---|---|---|
| CURRENT DRIVEN OPERATION | OPERATIVE TIME | INOPERATIVE TIME |
| PMOS TRANSISTOR 111 | Vdd-Vdsat OR LOWER | Vdd-Vdsat OR HIGHER |
| NOMS TRANSISTOR 114 | Vdsat OR HIGHER | Vdsat OR LOWER |

REFERENCE VOLTAGE GENERATOR CIRCUIT AND IMAGE PROCESSING APPARATUS

CROSS-REFERENCE TO RELATED APPLICATION

This application is based upon and claims the benefit of priority of the prior Japanese Patent Application No. 2010-185398, filed on Aug. 20, 2010, the entire contents of which are incorporated herein by reference.

FIELD

Embodiments relate to a reference voltage generator circuit and an image processing apparatus including the reference voltage generator circuit.

BACKGROUND

A reference current generator circuit supplying a reference current serving as a reference of circuit operation is used in an electronic circuit such as a large scale integrated circuit (LSI).

For example, a reference voltage or a reference current is needed to operate electronic circuits including an analog circuit having a complementary metal oxide semiconductor (CMOS) to operate. Such electronic circuit includes a reference current generator circuit to generate a reference current.

Japanese Laid-Open Patent Publication No. 2002-118451, Japanese Laid-Open Patent Publication No. 2005-285019, and Japanese Laid-Open Patent Publication No. 2009-066921 describe reference current generator circuits.

The reference current generated by the reference current generator circuit may be fed to a load circuit of the electronic circuit or drained from the load circuit.

The current-source type load circuit in which current is fed into and the current-sink type load circuit in which current is sunk therefrom are different from each other in the direction of current flow. The reference current generator circuit of a different type may be required depending on the type of the load circuit, in other words, the direction of current flow.

Since the current-source type load circuit and the current-sink type load circuit are different from each other in the direction of current flow, it is rather difficult to handle the reference circuit generator circuit as a black-box circuit. If the load circuit is connected to a reference current generator circuit in error, the load circuit is likely to malfunction.

It is desirable to provide a reference current generator circuit which can be connected to a load circuit regardless of the direction of current, and is easily handled as a black-box circuit, and to provide an information processing apparatus including the reference current generator circuit.

SUMMARY

According to an embodiment of the invention, a reference current generating circuit includes a reference voltage generating unit that generates a reference voltage, a bias voltage generating unit that includes a first transistor of a first conductive type and a second transistor of a second conductive type each outputs a reference current based on the reference voltage, and generates a first bias voltage and a second bias voltage, respectively, a first output transistor of a first conductive type that outputs a current corresponds to a reference current when the first bias voltage is supplied to its control terminal, a second output transistor of a second conductive type that outputs a current corresponds to a reference current when the second bias voltage is supplied to its control terminal, an input-output unit in which one terminal thereof is connected between an output terminal of the first output transistor and an input terminal of the second output terminal and the other terminal is connected to a load circuit, and supplies current from the first output transistor to the load circuit or supplies current from the load circuit to the second output transistor, and a switching unit that turns on or off the first output transistor and the second output transistor based on voltage of an output from the input-output unit.

A reference current generator circuit discussed herein is connected to a load circuit regardless of the direction of current, and is easily handled as a black-box circuit. Also discussed herein is an information processing apparatus including the reference current generator circuit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

The embodiments of a reference current generator circuit and an information processing apparatus are described below.

Figure 1:
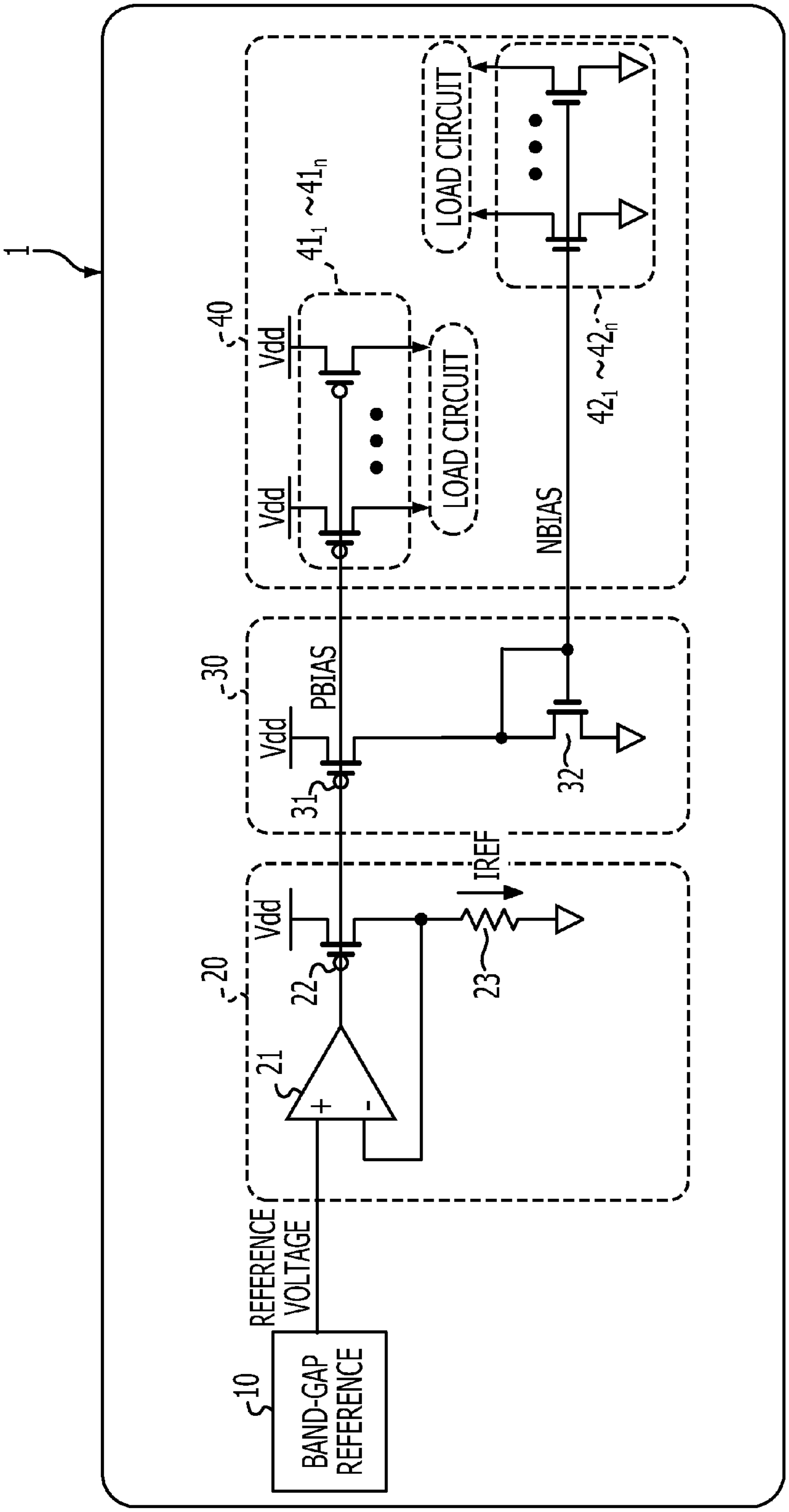
FIG. 1 illustrates a configuration of a reference current generator circuit.

Operations of a reference current generator circuit 1 illustrated in FIGS. 1 and 2 are described before the description of the reference current generator circuit of the embodiments.

FIG. 1 illustrates a circuit configuration of the reference current generator circuit 1.

The reference current generator circuit 1 of FIG. 1 includes a reference voltage generator circuit 10, a voltage-current converter circuit 20, a P-channel (Pch)-N-channel (Nch) converter circuit 30, and an output unit 40.

The reference current generator circuit 1 may be included in a high-speed serial interface circuit, a phase-locked loop (PLL), an analog-to-digital (A/D) converter or the like provided on a large-scale integrated circuit (LSI).

The reference current generator circuit 1 generates a reference current serving as a reference for a circuit operation of an analog circuit employing a CMOS transistor such as a high-speed serial interface circuit, a PLL circuit, an A/D converter or the like.

The reference voltage generator circuit 10 is implemented by a band gap reference circuit for example. The band gap reference circuit outputs a less temperature dependent constant voltage, i.e., a reference voltage. The band gap reference circuit employs a silicon band gap, and provides an output voltage of 1.25 V. The reference voltage generator circuit 10 converts an output voltage of 1.25 V into a desired reference voltage using voltage-dividing resistors.

The voltage-current converter circuit 20 includes an error amplifier 21, a PMOS transistor 22 and a resistor 23.

The error amplifier 21 is configured with the non-inverting input terminal thereof connected to the reference voltage generator circuit 10, with the output terminal thereof connected to a gate of the PMOS transistor 22, and with the inverting input terminal thereof receiving a drain current of the PMOS transistor 22 as a negative feedback.

The output terminal of the error amplifier 21 is also connected to gates of a plurality of PMOS transistors in the Pch-Nch converter circuit 30 and the output unit 40.

The output voltage of the error amplifier 21 is input to the gate of the PMOS transistor 22 in the Pch-Nch converter circuit 30 and the gates of PMOS transistors $41_1$-$41_n$ in the output unit 40.

The PMOS transistor 22 is configured with the gate thereof connected to the output terminal of the error amplifier 21, with the source thereof connected to a power source voltage Vdd, and with the drain thereof connected to the resistor 23.

The resistor 23 is connected between the drain of the PMOS transistor 22 and the ground, and has a resistance value defining the output current of the voltage-current converter circuit 20.

The error amplifier 21 in the voltage-current converter circuit 20 compares a reference voltage input from the reference voltage generator circuit 10 with a voltage caused across the terminals of the resistor 23, and drives the PMOS transistor 22 such that the voltage across the resistor 23 equals the reference voltage.

The gate voltage of the PMOS transistor 22 is input to the gates of the PMOS transistors $41_1$-$41_n$ in the output unit 40, and the gate of a PMOS transistor 31 in the Pch-Nch converter circuit 30. The gate voltage of the PMOS transistor 22 serves as a bias voltage PBIAS to drive the PMOS transistors 31 and $41_1$-$41_n$.

The voltage-current converter circuit 20 converts the reference voltage output by the reference voltage generator circuit 10 into a current Iref having a specific current value flowing from the drain of the PMOS transistor 22 to the resistor 23.

The Pch-Nch converter circuit 30 includes the PMOS transistor 31 and NMOS transistor 32.

The PMOS transistor 31 is configured with the gate thereof connected to the output terminal of the error amplifier 21 in the voltage-current converter circuit 20, with the source thereof connected to the power source voltage Vdd, and with the drain thereof connected to the drain of the NMOS transistor 32.

The drain of the NMOS transistor 32 is connected to the drain of the PMOS transistor 31 and the gate of the NMOS transistor 32. The NMOS transistor 32 is diode-connected to the PMOS transistor 31. More specifically, the same current Iref as the drain current of the PMOS transistor 31 flows through the drain of the NMOS transistor 32.

The NMOS transistor 32 is configured with the source thereof grounded, and with the gate thereof connected to the drain thereof. The gate of the NMOS transistor 32 is also connected to gates of NMOS transistors $42_1$-$42_n$ in the output unit 40.

The NMOS transistor 32 and the NMOS transistors $42_1$-$42_n$ in the output unit 40 form a current-mirror circuit.

The NMOS transistor 32 is diode-connected to the PMOS transistor 31. If the PMOS transistor 31 is turned on, the drain current Iref of the PMOS transistor 31 flows into the drain of the NMOS transistor 32. The NMOS transistor 32 is then turned on. The voltage caused at the gate of the NMOS transistor 32 is input to each of the NMOS transistors $42_1$-$42_n$ in the output unit 40 as a bias voltage NBIAS to drive the NMOS transistors $42_1$-$42_n$ in the output unit 40.

The NMOS transistors $42_1$-$42_n$ in the output unit 40 permit currents to flow therethrough in accordance with a ratio of a size of the NMOS transistor 32 to each of the NMOS transistors $42_1$-$42_n$ in the output unit 40.

The drain current of the NMOS transistor 32 is a reference current serving as a current to be generated by the NMOS transistors $42_1$-$42_n$ in the output unit 40. The size ratio of the NMOS transistor 32 to each of the NMOS transistors $42_1$-$42_n$ in the output unit 40 may be set such that the NMOS transistors $42_1$-$42_n$ in the output unit 40 can generate currents necessary for the load circuit connected to the output unit 40, in view of the PMOS transistor 22 in the voltage-current converter circuit 20 and the PMOS transistor 31 in the Pch-Nch converter circuit 30.

The output unit 40 includes n PMOS transistors $41_1$-$41_n$ and n NMOS transistors $42_1$-$42_n$. Here, n is an integer of 1 or larger.

The PMOS transistors $41_1$-$41_n$ each has a gate thereof connected to the gate of the PMOS transistor 22, and form a current mirror circuit with reference to the PMOS transistor 22.

The PMOS transistors $41_1$-$41_n$ each has a source thereof connected to the power source voltage Vdd, and a drain thereof connected to respective load circuits.

The load circuit may be an analog circuit employing a CMOS transistor, such as a high-speed serial interface circuit, a PLL circuit, an operational amplifier included in an A/D converter, or the like. The load circuit is described with reference to FIG. 2.

If the bias voltage PBIAS is input from the error amplifier 21 in the voltage-current converter circuit 20 to the gates of the PMOS transistors $41_1$-$41_n$, the PMOS transistors $41_1$-$41_n$ output, from the drains thereof, currents having current values responsive to the size ratios of the PMOS transistor 22 to the PMOS transistors $41_1$-$41_n$.

The same current Iref as the drain current of the PMOS transistor 22 flows through each of the load circuits that are respectively connected to a drain of the corresponding PMOS transistors $41_1$-$41_n$ on a one-load to one-drain basis.

The NMOS transistors $42_1$-$42_n$ are respectively connected to the gate of the NMOS transistor 32, and form a current-mirror circuit with reference to the NMOS transistor 32.

Load circuits are respectively connected to a drain of the corresponding NMOS transistors $42_1$-$42_n$ on a one-load to one-source basis. The source of each of the NMOS transistors $42_1$-$42_n$ are grounded.

The load circuit that may respectively connected to the source of the corresponding NMOS transistor $42_1$-$42_n$ may be an analog circuit, employing a CMOS transistor such as a high-speed serial interface circuit, a PLL circuit, an operational amplifier included in an A/D converter, or the like.

If the bias voltage NBIAS is input from the NMOS transistor 32 to the gates of the NMOS transistors $42_1$-$42_n$, the NMOS transistors $42_1$-$42_n$ permit to flow through the drains thereof currents having values responsive to the size ratios of the NMOS transistor 32 to the NMOS transistors $42_1$-$42_n$.

It is assumed that the size of the NMOS transistor 32 is equal to the size of each of the NMOS transistors $42_1$-$42_n$.

The same current Iref as the drain current of the NMOS transistor 32 is drained from the load circuits respectively connected to a corresponding one of the NMOS transistors $42_1$-$42_n$ on a one-load to one-drain basis.

Figure 2A:
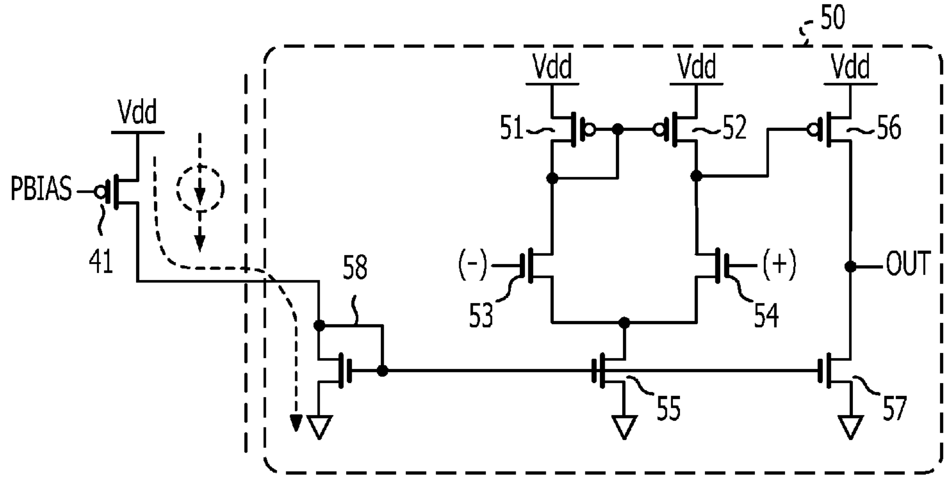
FIGS. 2A and 2B illustrate a connection between the reference current generator circuit and a load circuit.

Connection relationships between the reference current generator circuit and the load circuit are described with reference to FIGS. 2A and 2B. One of the PMOS transistors $41_1$-$41_n$ is illustrated in FIG. 2A and is referred to as a PMOS transistor 41. One of the NMOS transistors $42_1$-$42_n$ is illustrated in FIG. 2B and is referred to as an NMOS transistor 42.

Figure 2B:
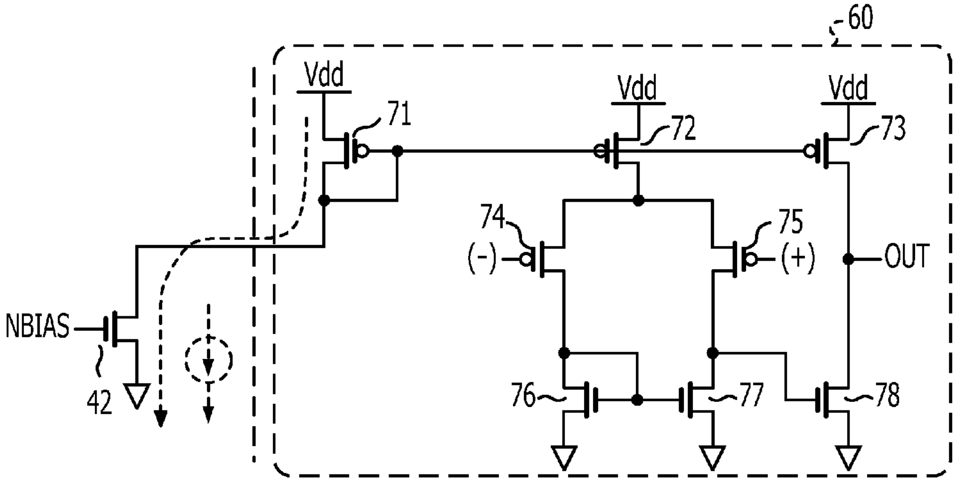

FIG. 2A illustrates the connection relationship between the PMOS transistor 41 and a load circuit 50, and FIG. 2B illustrates the connection relationship between the NMOS transistor 42 and a load circuit 60.

An operation of causing a current to flow into the load circuit is described with reference to FIG. 2A.

The load circuit 50 of FIG. 2A is an operational amplifier. The load circuit 50 as an operational amplifier includes PMOS transistors 51 and 52, NMOS transistors 53, 54, and 55, PMOS transistor 56, and NMOS transistors 57 and 58.

The PMOS transistors 51 and 52 have sources thereof connected together with the power source voltage Vdd, and gates thereof mutually connected to each other. The PMOS transistor 51 has the gate thereof connected to a drain thereof. Drains of the PMOS transistors 51 and 52 are respectively connected to drains of the NMOS transistors 53 and 54. The PMOS transistors 51 and 52 form a current-mirror circuit.

A gate of the NMOS transistor 53 serves as an inverting input terminal (−) of the operational amplifier, and a gate of the NMOS transistor 54 serves as a non-inverting input terminal (+) of the operational amplifier.

The NMOS transistors 53 and 54 have sources connected together to a drain of the NMOS transistor 55.

The PMOS transistor 56 has a source thereof connected to the power source voltage Vdd, and a gate thereof connected to the drain of the PMOS transistor 52. The PMOS transistor 56 has a drain thereof connected to a drain of the NMOS transistor 57. A node between the drain of the PMOS transistor 56 and the drain of the NMOS transistor 57 serves as an output terminal OUT of the operational amplifier.

Sources of the NMOS transistors 55 and 57 are grounded. Gates of the NMOS transistors 55 and 57 are connected together.

The load circuit 50 as the operational amplifier is connected to the drain of the PMOS transistor 41 in the reference current generator circuit 1 of FIG. 1 via the NMOS transistor 58.

The NMOS transistor 58 has a source thereof grounded, and a drain thereof connected to a gate thereof and the drain of the PMOS transistor 41. In other words, the NMOS transistor 58 is diode-connected between the PMOS transistor 41 and the ground.

The gate of the NMOS transistor 58 is also connected to the gates of the NMOS transistors 55 and 57 in the load circuit 50.

If the bias voltage PBIAS is input from the error amplifier 21 in the voltage-current converter circuit 20 to the gate of the PMOS transistor 41, the PMOS transistor 41 outputs from its drain a current multiplying the drain current of the PMOS transistor 22 by the size ratio.

The size of the PMOS transistor 41 is set to be with respect to the size of the PMOS transistor 22 in response to the reference current that the load circuit 50 needs. The PMOS transistor 41 functions as a constant current source outputting the reference current for the load circuit 50.

The reference current for the load circuit 50 is caused to flow into the load circuit 50 connected to the drain of the PMOS transistor 41 as illustrated in FIG. 2A. As a result, the load circuit 50 becomes operative as an operational amplifier.

FIG. 2A illustrates one PMOS transistor 41 and one load circuit 50. In practice, n load circuits 50 may be respectively connected to one of the n PMOS transistors $41_1$-$41_n$.

The current having the same value as the drain current of the PMOS transistor 22 is caused to flow into each of the n load circuits 50 via each of the corresponding n PMOS transistors $41_1$-$41_n$.

The operation of draining current from the load circuit is described below with reference to FIG. 2B.

The load circuit 60 of FIG. 2B is an operational amplifier. The load circuit 60 as an operational amplifier includes PMOS transistors 71, 72, 73, 74 and 75, and NMOS transistors 76, 77 and 78.

The load circuit 60 as the operational amplifier is connected to a drain of the NMOS transistor 42 in the reference current generator circuit 1 via the PMOS transistor 71.

The PMOS transistor 71 has a source thereof connected to a power source voltage Vdd, and a drain thereof connected to a gate thereof and the drain of the NMOS transistor 42. In other words, the PMOS transistor 71 is diode-connected between the NMOS transistor 42 and the power source.

The gate of the PMOS transistor 71 is connected to gates of the PMOS transistors 72 and 73.

The PMOS transistor 72 has a gate thereof connected to the gates of the PMOS transistors 71 and 73, a source thereof connected to the power source voltage Vdd, and a drain thereof connected to sources of the PMOS transistors 74 and 75.

The PMOS transistor 73 has the gate thereof connected to the gates of the PMOS transistors 71 and 72, a source thereof connected to the power source voltage Vdd, and a drain thereof connected to a drain of the NMOS transistor 78.

The PMOS transistor 74 has a gate thereof serving as an inverting input terminal (−) of the operational amplifier, a source thereof connected to the drain of the PMOS transistor 72, and a drain thereof connected to a drain of the NMOS transistor 76.

The PMOS transistor 75 has a gate thereof serving as a non-inverting input terminal (+) of the operational amplifier, a source thereof connected to the drain of the PMOS transistor 72, and a drain thereof connected to a drain of the NMOS transistor 77.

The NMOS transistor 76 has a gate thereof connected to the drain thereof and a gate of the NMOS transistor 77, the drain thereof connected to the drain of the PMOS transistor 74, and a source thereof grounded. The NMOS transistor 76 is diode-connected to the PMOS transistor 74.

The NMOS transistor 77 has the gate thereof connected to the gate of the NMOS transistor 76, the drain thereof connected to the drain of the PMOS transistor 75, and a source thereof grounded.

The NMOS transistor 78 has a gate thereof connected to the drain of the PMOS transistor 75 and the drain of the NMOS transistor 77, a drain thereof connected to the drain of the PMOS transistor 73, and a source thereof grounded.

A node between the drain of the PMOS transistor 73 and the drain of the NMOS transistor 78 serves as an output terminal OUT of the operational amplifier.

If the bias voltage NBIAS is input from the NMOS transistor 32 to the gate of the NMOS transistor 42, the NMOS transistor 42 outputs from the drain thereof the current having the same value Iref as that of the drain current of the NMOS transistor 32.

The size of the NMOS transistor 32 is set to be with respect to the size of the PMOS transistor 22 in FIG. 1 in response to the reference current that the load circuit 60 needs. The NMOS transistor 42 thus functions as a constant current source outputting the reference current needed for the load circuit 60.

The reference current for the load circuit 60 is drain through the load circuit 60 connected to the drain of the NMOS transistor 42 illustrated in FIG. 2B. As a result, the load circuit 60 becomes operative as an operational amplifier.

FIG. 2B illustrates one NMOS transistor 42 and one load circuit 60. In practice, n load circuits 60 may be respectively connected to one of the n NMOS transistors $\mathbf{42}_1$-$\mathbf{42}_n$.

The current having the same value as that of the drain current of the NMOS transistor 32 is caused to flow out of each of the n load circuits 60 via a corresponding one of the n NMOS transistors $\mathbf{42}_1$-$\mathbf{42}_n$.

In this way, the current flowing between the reference current generator circuit 1 and the load circuit is different in direction from the current flowing between the current-sink type load circuit 50 and the current-source type load circuit 60. The load circuit 50 needs a current to flow thereinto, and the load circuit 60 needs a current to flow out therefrom.

The reference current generator circuit 1 of FIG. 1 includes two types of circuits, the PMOS transistors $\mathbf{41}_1$-$\mathbf{41}_n$ to cause a current to flow into the load circuit 50 and the NMOS transistors $\mathbf{42}_1$-$\mathbf{42}_n$ to cause a current to flow out of the load circuit 60.

The number of load circuits 50 require a current to flow thereinto and the number of load circuits 60 require a current to flow out thereof may be different depending on a host apparatus having the reference current generator circuit 1 mounted thereon.

If the connection of the load circuits 50 and 60 to the PMOS transistors $\mathbf{41}_1$-$\mathbf{41}_n$ and the NMOS transistors $\mathbf{42}_1$-$\mathbf{42}_n$ is wrong, the load circuits 50 and 60 malfunction, as the directions of current of the two types of load circuits are opposite to each other.

For this reason, PMOS transistors $\mathbf{41}_1$-$\mathbf{41}_n$ and NMOS transistors $\mathbf{42}_1$-$\mathbf{42}_n$ in the output unit 40 have been separately manufactured considering the number of and layout of the load circuit 50 of current-sink type and the load circuit 60 of current-source type in the manufacturing of the reference current generator circuit 1.

Requirements of multi-type production and short-time circuit development for an electronic circuit such as LSI are mounting. A reference current generator circuit is a basic circuit element, and is desirably to be a common circuit in order to be connected to a large number of electronic circuits regardless of the direction of current.

To enhance circuit commonness, the reference current generator circuit having the current direction fixed to one of the current-sink type and the current-source type is manufactured, and if a load circuit having an opposite current direction is used, a current-mirror circuit may be used to reverse the direction of current.

Since the current-mirror circuit includes a plurality of MOS transistors, a noise such as thermal noise or flickering noise, or characteristics variations in the MOS transistors may cause a decrease in the accuracy of current copying.

The connection relationship between the reference current generator circuit and the load circuit is different depending on whether the load circuit is of the current-sink type or the current-source type. It is thus difficult to treat the reference current generator circuit as a black-box circuit. If the connection between the reference current generator circuit and the load circuit is in error, the load circuit may malfunction.

Reference current generator circuits described below in the following embodiments are free from the above-described problem.

Figure 3:
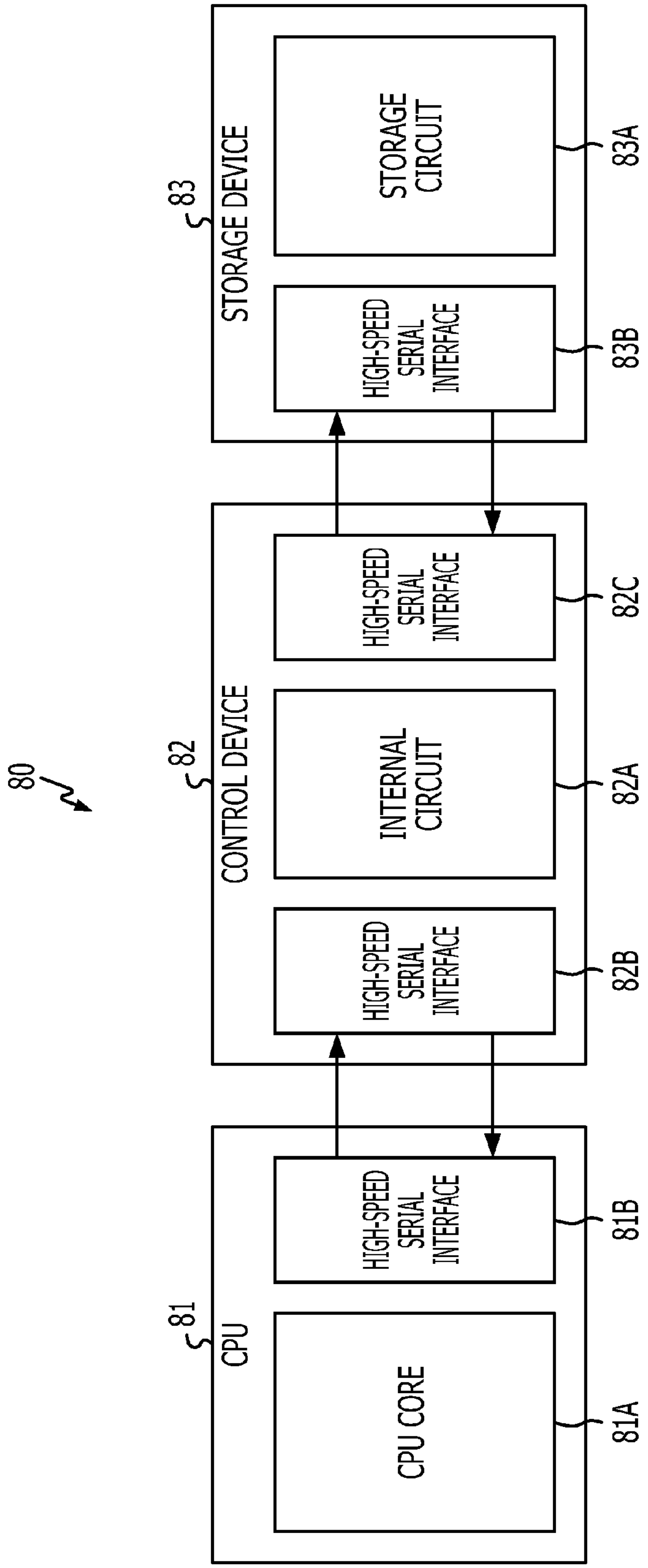
FIG. 3 illustrates a server including the reference current generator circuit of a first embodiment.

FIG. 3 is a server 80 including the reference current generator circuit 1 of a first embodiment of the invention.

The server 80 including the reference current generator circuit of the first embodiment includes a CPU 81, a control device 82 and a storage device 83.

The CPU 81 is a central processing device including a CPU core 81A and a high-speed serial interface circuit 81B. The high-speed serial interface circuit 81B performs high-speed data communications between the CPU core 81A and the control device 82.

The control device 82 is arranged between the CPU 81 and the storage device 83. The CPU 81 is connected to the storage device 83 via a bus, for example. The control device 82 includes an internal circuit 82A, and high-speed serial interface circuits 82B and 82C. The internal circuit 82A may include a memory controller and a chip set. The high-speed serial interface circuit 82B performs high-speed data communications between the CPU 81 and the internal circuit 82A. The high-speed serial interface circuit 82C performs high-speed data communications between the internal circuit 82A and the storage device 83.

The storage device 83 includes a storage circuit 83A and a high-speed serial interface circuit 83B. The storage circuit 83A includes a main memory device such as a read-only memory (ROM) or a random-access memory (RAM), or an auxiliary memory device such as a hard disk. The high-speed serial interface circuit 83B performs high-speed data communications between the control device 82 and the storage circuit 83A.

Each of the high-speed serial interface circuits 81B, 82B, 82C and 83B in the server 80 includes a reference current generator circuit as such interface circuits includes an analog signal circuit having a CMOS transistor. The reference current generator circuit of the first embodiment is mounted on each of the high-speed serial interface circuits 81B, 82B, 82C and 83B, for example.

Figure 4:
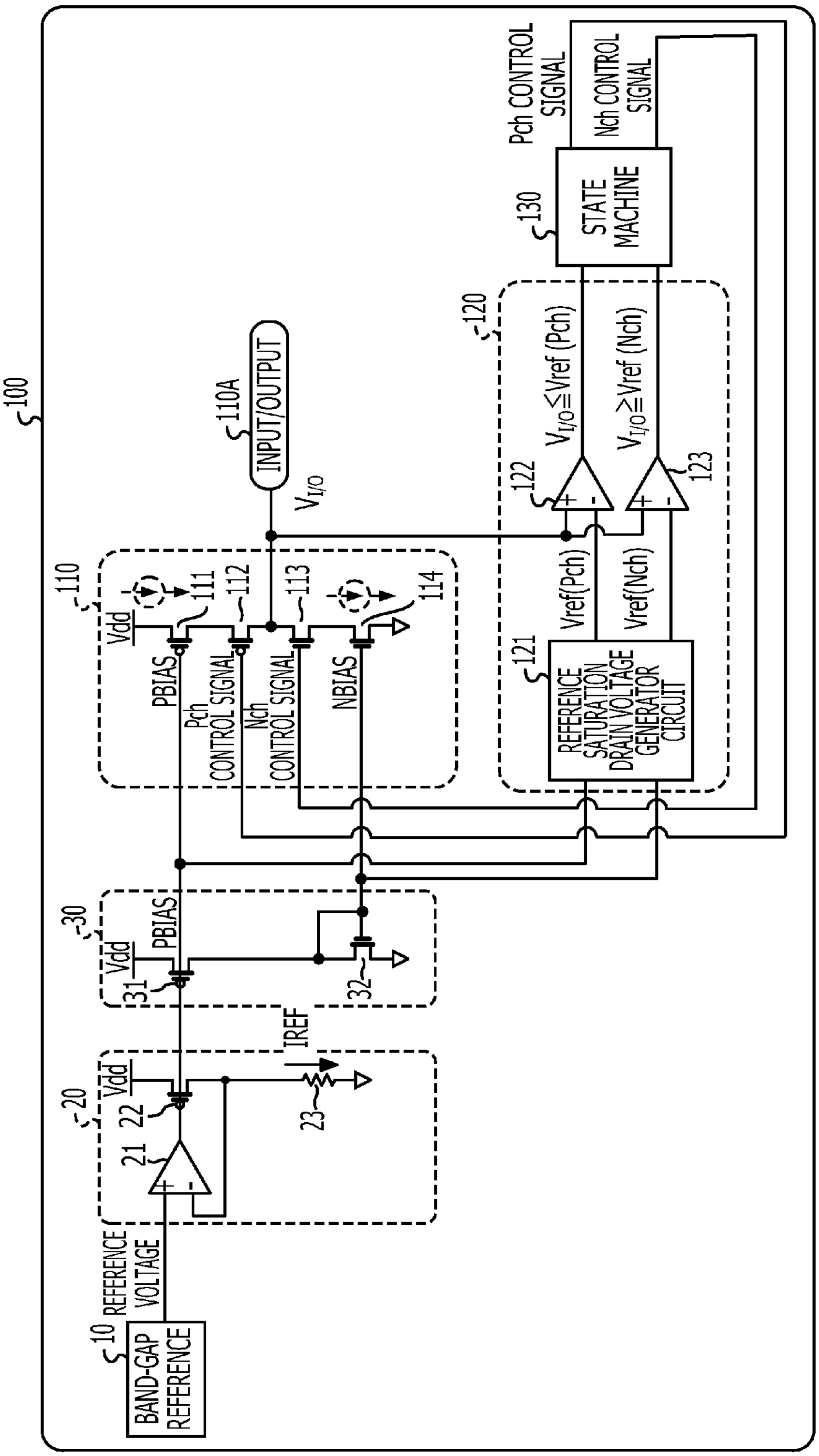
FIG. 4 illustrates the reference current generator circuit of the first embodiment.

FIG. 4 illustrates an example of a reference current generator circuit 100.

The reference current generator circuit 100 of FIG. 4 includes reference voltage generator circuit 10, voltage-current converter circuit 20, Pch-Nch converter circuit 30, input-output unit 110, output voltage determining unit 120 and state machine 130.

The reference voltage generator circuit 10, the voltage-current converter circuit 20 and the Pch-Nch converter circuit 30 illustrated in FIG. 4 are respectively identical to the reference voltage generator circuit 10, the voltage-current converter circuit 20, and the Pch-Nch converter circuit 30 in the reference current generator circuit 1 of FIG. 1, and a description thereof is omitted here.

The reference voltage generator circuit 10 is an example of a reference voltage generator unit for generating a reference voltage. The voltage-current converter circuit 20 and the Pch-Nch converter circuit 30 are an example of a bias voltage generator unit for generating as a first bias voltage (a bias voltage PBIAS) and as a second bias voltage (a bias voltage NBIAS).

The PMOS transistor 31 included in the Pch-Nch converter circuit 30 is an example of a first transistor of a first conductive type included in the bias voltage generator unit. The NMOS transistor 32 in the Pch-Nch converter circuit 30 is an example of a second transistor of a second conductive type included in the bias voltage generator unit. The PMOS transistor 22 in the voltage-current converter circuit 20 is an example of a third transistor of the first conductive type.

The input-output unit 110 includes a PMOS transistor 111, a PMOS transistor 112, an NMOS transistor 113 and an NMOS transistor 114. The PMOS transistor 111, the PMOS transistor 112, the NMOS transistor 113 and the NMOS transistor 114 are connected in series between the power source voltage Vdd and the ground. The PMOS transistor 111 and the PMOS transistor 112 are cascode-connected, and the NMOS transistor 113 and the NMOS transistor 114 are cascode-connected.

The input-output unit 110 includes an input-output terminal 110A at the node of the PMOS transistor 112 and the NMOS transistor 113. The load circuit can be connected to the input-output terminal 110A.

The load circuit may be an analog circuit having a CMOS transistor, such as an operational amplifier included in a high-speed serial interface circuit, a PLL circuit and an A/D converter or the like.

The input-output unit 110 outputs a current via the input-output terminal 110A to sink the current into the load circuit and receives a current via the input-output terminal 110A to draw the current from the load circuit.

The PMOS transistor 111 has the source thereof connected to the power source voltage Vdd, the gate thereof connected to the output of the error amplifier 21 and the gate of the PMOS transistor 22 in the voltage-current converter circuit 20, and the drain thereof connected to the source of the PMOS transistor 112. The PMOS transistor 111 and the PMOS transistor 22 in the voltage-current converter circuit 20 form a current-mirror circuit.

The PMOS transistor 111 serves as an example of a first current output transistor. The PMOS transistor 111 is driven by the bias voltage PBIAS received from the PMOS transistor 31, and outputs a current having a value equal to the value of the drain current of the PMOS transistor 22. The output current is used as a reference current caused to flow into the load circuit.

In other words, the PMOS transistor 111 functions as a constant current source that outputs the current having the value Iref equal to the drain current of the PMOS transistor 22. The PMOS transistor 111 is thus a source current source. The PMOS transistor 111 is labeled with a current source symbol close thereto in FIG. 4.

The PMOS transistor 112 has the source thereof connected to the drain of the PMOS transistor 111, the gate thereof connected to the state machine 130, and the drain thereof connected to the drain of the NMOS transistor 113 and the input-output terminal 110A of the input-output unit 110.

The PMOS transistor 112 is turned on or off in response to a Pch control signal received at the gate thereof from the state machine 130. When the PMOS transistor 112 is turned on, the PMOS transistor 111 is connected to the input-output terminal 110A. When the PMOS transistor 112 is turned off, the PMOS transistor 111 is isolated from the input-output terminal 110A.

The NMOS transistor 113 has the drain thereof connected to the drain of the PMOS transistor 112 and the input-output terminal 110A of the input-output unit 110, the gate thereof connected to the state machine 130, and the source thereof connected to the drain of the NMOS transistor 114.

The NMOS transistor 114 has the drain thereof connected to the source of the NMOS transistor 113, the gate thereof connected to the gate of the NMOS transistor 32 in the Pch-Nch converter circuit 30, and the source thereof grounded. The NMOS transistor 114 and the NMOS transistor 32 in the Pch-Nch converter circuit 30 form a current-mirror circuit.

The NMOS transistor 114 serves as an example of a second current output transistor. The NMOS transistor 114 is driven by the bias voltage NBIAS received from the NMOS transistor 32, and outputs a current having a current value equal to the current value of the drain current of the NMOS transistor 32. The output current is a reference current caused to be drawn out of the load circuit.

In other words, the NMOS transistor 114 functions as a constant current source that outputs the current having the current value Iref equal to the NMOS transistor 32, i.e., functions as a sink current source. The NMOS transistor 114 is labeled a current source symbol close thereto in FIG. 4.

The NMOS transistor 113 is turned on or off in response to an Nch control signal received at the gate thereof from the state machine 130. When the NMOS transistor 113 is turned on, the NMOS transistor 114 is connected to the input-output terminal 110A. When the NMOS transistor 113 is turned off, the NMOS transistor 114 is isolated from the input-output terminal 110A.

The Pch control signal supplied from the state machine 130 to the gate of the PMOS transistor 112 has phase opposite from the Nch control signal supplied from the state machine 130 to the gate of the NMOS transistor 113. For this reason, the on/off operation of the PMOS transistor 112 and the on/off operation of the NMOS transistor 113 are performed in an opposite phase. This arrangement prevents the input-output terminal 110A of the input-output unit 110 from being concurrently connected to the PMOS transistor 111 and the NMOS transistor 114. Either one of the PMOS transistor 111 and the NMOS transistor 114 is connected to the input-output terminal 110A at the same time, or none of the PMOS transistor 111 and the NMOS transistor 114 is connected to the input-output terminal 110A.

The PMOS transistor 112 and the NMOS transistor 113 function as an example of a switching circuit that selects either one of the PMOS transistor 111 and the NMOS transistor 114 to be connected to the input-output terminal 110A connected to the load circuit.

The output voltage determining unit 120 includes a reference saturation drain voltage generator circuit 121, and comparators 122 and 123.

The reference saturation drain voltage generator circuit 121 generates a saturation drain voltage $V_{DS}$ serving as a boundary between an operative region and an inoperative region of each of the PMOS transistor 112 and the NMOS transistor 113.

In response to the bias voltage PBIAS and the bias voltage NBIAS, the reference saturation drain voltage generator circuit 121 generates a saturation drain voltage Vref(Pch) of the PMOS transistor 112 and a saturation drain voltage Vref (Nch) of the NMOS transistor 113. A configuration of the reference saturation drain voltage generator circuit 121 is described below.

The comparator 122 has the non-inverting input terminal (+) thereof connected to the input-output terminal 110A of the input-output unit 110, and the inverting input terminal (−) thereof connected to the reference saturation drain voltage generator circuit 121. The comparator 122 receives at the non-inverting input terminal (+) thereof a voltage $V_{I/O}$ from the input-output terminal 110A, and at the inverting input terminal (−) thereof the saturation drain voltage Vref(Pch) of the PMOS transistor 112 from the reference saturation drain voltage generator circuit 121.

The comparator 122 compares the voltage $V_{I/O}$ of the input-output terminal 110A with the saturation drain voltage Vref(Pch), and inputs to the state machine 130 a signal representing the comparison results.

The comparator 123 has the non-inverting input terminal (+) thereof connected to the input-output terminal 110A of the input-output unit 110, and the inverting input terminal (−) thereof connected to the reference saturation drain voltage generator circuit 121. The comparator 123 thus receives at the non-inverting input terminal (+) thereof the voltage $V_{I/O}$ from the input-output terminal 110A, and at the inverting input terminal (−) thereof the saturation drain voltage Vref(Nch) of the NMOS transistor 113 from the reference saturation drain voltage generator circuit 121.

The comparator 123 compares the voltage $V_{I/O}$ of the input-output terminal 110A with the saturation drain voltage Vref(Nch), and inputs to the state machine 130 a signal representing the comparison results.

The voltage $V_{I/O}$ of the input-output terminal 110A equals to each of the drain voltage of the PMOS transistor 112 and the drain voltage of the NMOS transistor 113.

The state machine 130 has a pair of input terminals respectively connected to the output terminals of the comparators 122 and 123. The state machine 130 has a pair of output terminals respectively connected to the gate of the PMOS transistor 112 and the gate of the NMOS transistor 113.

In response to the comparison results from the comparator 122 and the comparator 123, the state machine 130 outputs the Pch control signal for on/off controlling the PMOS transistor 112 and the Nch control signal for on/off controlling the NMOS transistor 113.

The output voltage determining unit 120 and the state machine 130 functioning as a selection unit to select the on/off operation of the PMOS transistor 112 and the on/off operation of the NMOS transistor 113 in response to the voltage $V_{I/O}$ from the input-output terminal 110A of the input-output unit 110.

The state machine 130 is a digital circuit including a logical circuit such a flipflop or a counter. A process of the state machine 130 is described below.

In the reference current generator circuit 100, the PMOS transistor 111 receives at the gate thereof the bias voltage PBIAS from the error amplifier 21 in the voltage-current converter circuit 20, and the NMOS transistor 114 receives at the gate thereof the bias voltage NBIAS from the Pch-Nch converter circuit 30.

The reference current generator circuit 100 turns on one of the PMOS transistor 112 and the NMOS transistor 113 in response to the type of the load circuit connected to the input-output terminal 110A, i.e., depending on whether the load circuit is of the current-sink type or the current-source type. The reference current generator circuit 100 thus causes a current to sink in the load circuit or a current to be drawn out of the load circuit.

A technique of turning on one of the PMOS transistor 112 and the NMOS transistor 113 in response to the type of the load circuit connected to the input-output terminal 110A is described below.

Figure 5A:
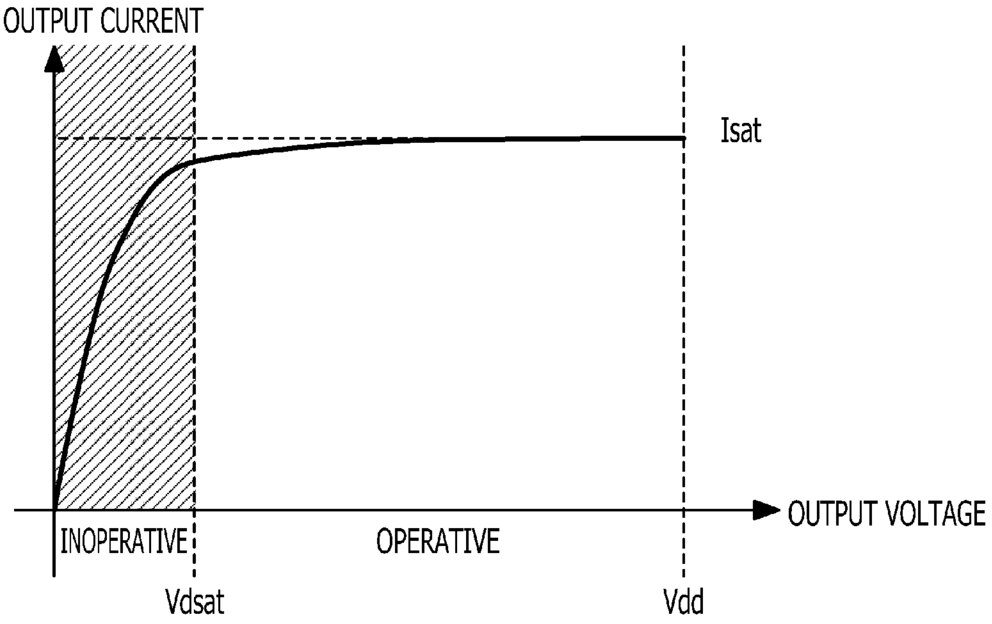
FIG. 5A illustrates a characteristic chart representing a relationship between an output voltage and an output current of an NMOS transistor.
Figure 5B:
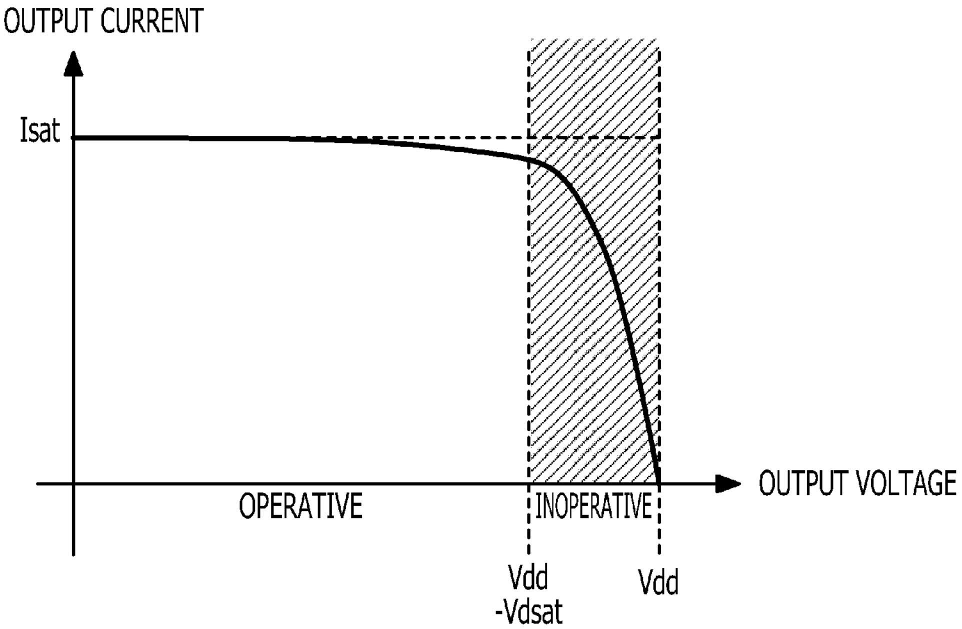
FIG. 5B illustrates a characteristic chart representing a relationship between an output voltage and an output current of a PMOS transistor.

FIGS. 5A and 5B illustrate the operative regions of the PMOS transistor 111 and the NMOS transistor 114 serving as current sources.

FIG. 5A illustrates a characteristics chart representing a relationship between an output voltage and an output current of the NMOS transistor 114. FIG. 5B illustrates a characteristics chart representing a relationship between an output voltage and an output current of the PMOS transistor 111.

FIG. 5A illustrates the relationship between the output voltage, namely, the drain voltage of the NMOS transistor 114 and the output current, namely, the drain current $V_{DS}$ of the NMOS transistor 114 with a bias voltage Vgs (=Vth_n+Vov) applied to the gate of the NMOS transistor 114. The bias voltage Vgs is applied to the NMOS transistor 114 to cause a rated current to flow to the gate thereof. Vgs represents the gate voltage of the NMOS transistor 114 with respect to the source thereof, Vth_n represents a threshold voltage of the NMOS transistor 114, and Vov represents an overdrive voltage of the NMOS transistor 114.

If the output voltage is equal to or lower than Vdsat(Vgs−Vth), the source-drain voltage is not sufficient, and the NMOS transistor 114 operates in a linear region, in other words, a non-operative region. The NMOS transistor 114 thus fails to provide characteristics in which the output current remains constant with respect to the output voltage.

The NMOS transistor 114 needs to be operated under the operative condition in which the output current remains constant with respect to the output voltage.

To draw current, the voltage at the input-output terminal 110A needs to be equal to or higher than a saturation drain voltage Vdsat where the NMOS transistor 114 enters a saturation region.

Generally, the saturation drain voltage is expressed in equation (1) in accordance with the square law of transistor:

$$Vdsat = Vov = Vgs - Vth = \sqrt{\frac{2 \cdot Ids \cdot L}{\mu Cox \cdot W}} \tag{1}$$

The reference saturation drain voltage generator circuit 121 generates the saturation drain voltage Vdsat serving as a boundary between the operative region and the inoperative region of the NMOS transistor 114.

The saturation drain voltage Vdsat of the NMOS transistor 114 is defined as a voltage having a value where the drain current of the NMOS transistor 114 is equal to or higher than 90% of the saturation drain current Isat. A percentage of 90% is an example only. An appropriate percentage value may be set depending on the use environment and operating conditions of the reference current generator circuit 100.

FIG. 5B illustrates the relationship between the output voltage, namely, the drain voltage $V_{DS}$ and the output current, namely, the drain current of the PMOS transistor 111 with a bias voltage Vgs (=Vth_p−Vov) applied to the gate of the PMOS transistor 111. The bias voltage Vgs is applied to the PMOS transistor 111 to cause a rated current to flow to the gate thereof. Vgs represents the gate voltage of the PMOS transistor 111 with respect to the source thereof. Vth_p represents a threshold voltage of the PMOS transistor 111, and Vov represents an overdrive voltage of the PMOS transistor 111.

In a region where the output voltage is higher than Vdd−Vov (=Vdd−Vdsat), the PMOS transistor 111 is in a linear operative region, and fails to provide characteristics in which the output current remains constant with respect to the output voltage.

In the current-sink type operation, the PMOS transistor 111 needs to be operated under the operative condition in which the output current remains constant with respect to the output voltage.

To cause current to flow in, the voltage at the input-output terminal 110A needs to be equal to or lower than a saturation drain voltage Vdd−Vdsat where the PMOS transistor 111 enters a saturation region.

The saturation drain voltage Vdd−Vdsat of the PMOS transistor 111 is defined as a voltage having a value where the drain current of the PMOS transistor 111 is equal to or higher than 90% of the saturation drain current Isat.

The relationship between the drain voltage and the operative region of each of the PMOS transistor 111 and the NMOS transistor 114 is described with reference to FIGS. 6A and 6B.

Figures 6A, 6B:
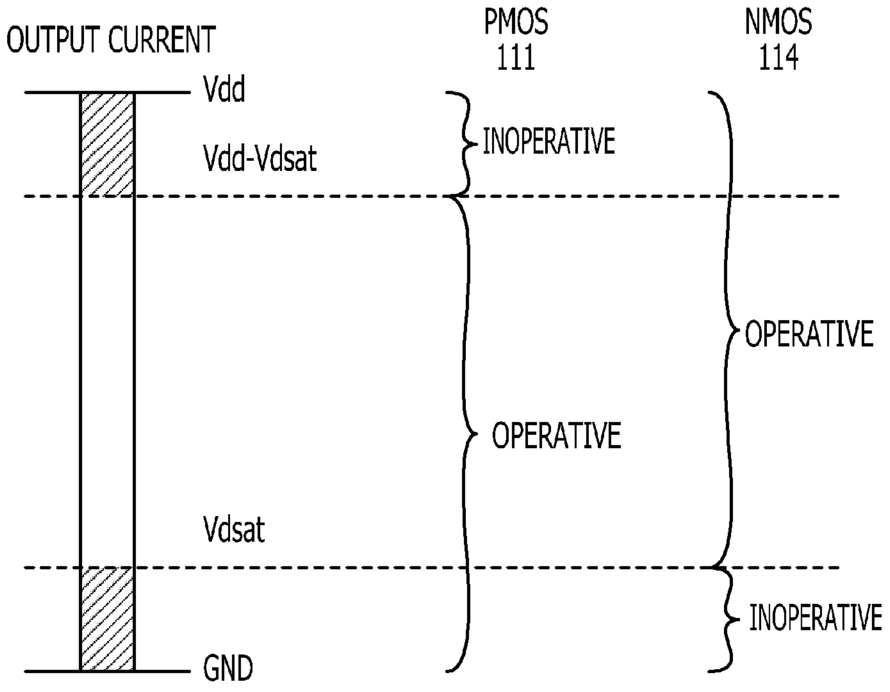
FIG. 6A illustrates a relationship between a drain voltage and an operative region of each of the PMOS transistor and the NMOS transistor in the reference current generator circuit of the first embodiment.
FIG. 6B illustrates operative conditions of the PMOS transistor and the NMOS transistor in the reference current generator circuit of the first embodiment.

FIG. 6A illustrates the relationship between the drain voltage and the operative region of each of the PMOS transistor 111 and the NMOS transistor 114 in the reference current generator circuit 100. FIG. 6B illustrates an operative condition of the PMOS transistor 112 and the NMOS transistor 113 in the reference current generator circuit 100.

As illustrated in FIG. 6A, the PMOS transistor 111 is turned on with the drain voltage thereof equal to or lower than Vdd−Vdsat, and turned off with the drain voltage thereof higher than Vdd−Vdsat.

Also as illustrated in FIG. 6A, the NMOS transistor 114 is turned on with the drain voltage thereof equal to or higher than Vdsat, and is turned off with the drain voltage lower than Vdsat.

In order to control the on/off operation of the PMOS transistor 111 and the NMOS transistor 114, the PMOS transistor 112 is turned on with the NMOS transistor 113 turned off if the voltage at the input-output terminal 110A is equal to or higher than Vdsat and lower than Vdd−Vdsat. The PMOS transistor 112 is turned off with the NMOS transistor 113 turned on if the drain voltage is equal to or higher than Vdd−Vdsat.

The saturation drain voltage Vref(Pch) generated by the reference saturation drain voltage generator circuit 121 is set to Vdd−Vdsat, and the saturation drain voltage Vref(Nch) is set to be Vdsat. This setting causes the above-described operation to be enabled.

A configuration of the reference saturation drain voltage generator circuit 121 is described with reference to FIGS. 7 and 8.

Figure 7:
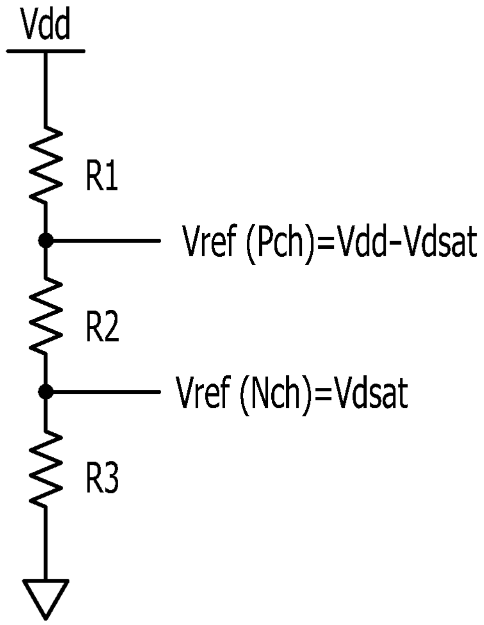
FIG. 7 illustrates a reference saturation drain voltage generator circuit.

FIG. 7 illustrates a comparative example of a circuit used as a reference saturation drain voltage generator circuit.

As long as a circuit outputs two levels of voltage, e.g., the voltage Vdd−Vdsat as the saturation drain voltage Vref(Pch) and the voltage Vdsat as the saturation drain voltage Vref(Nch), the circuit works as a reference saturation drain voltage generator circuit.

As illustrated in FIG. 7, the circuit outputting two levels of voltage Vdd−Vdsat and Vdd includes three resistors R1, R2, and R3 connected in series between the power source and the ground, and thus outputs the voltage Vdd−Vdsat at a node between the resistors R1 and R2 and the voltage Vdsat at a node between the resistors R2 and R3. The ratio of the resistors R1, R2, and R3 are adjusted.

If the circuit is used as a reference saturation drain voltage generator circuit, the voltage Vdd−Vdsat is applied as the saturation drain voltage Vref(Pch) to the inverting input terminal (−) of the comparator 122 and the voltage Vdsat is applied as the saturation drain voltage Vref(Nch) to the inverting input terminal (−) of the comparator 123.

The voltages Vdd−Vdsat and Vdsat may vary in response to fluctuations in the power source voltage Vdd in the circuit of the resistors R1, R2, and R3 simply serially connected as illustrated in FIG. 7.

Figure 8:
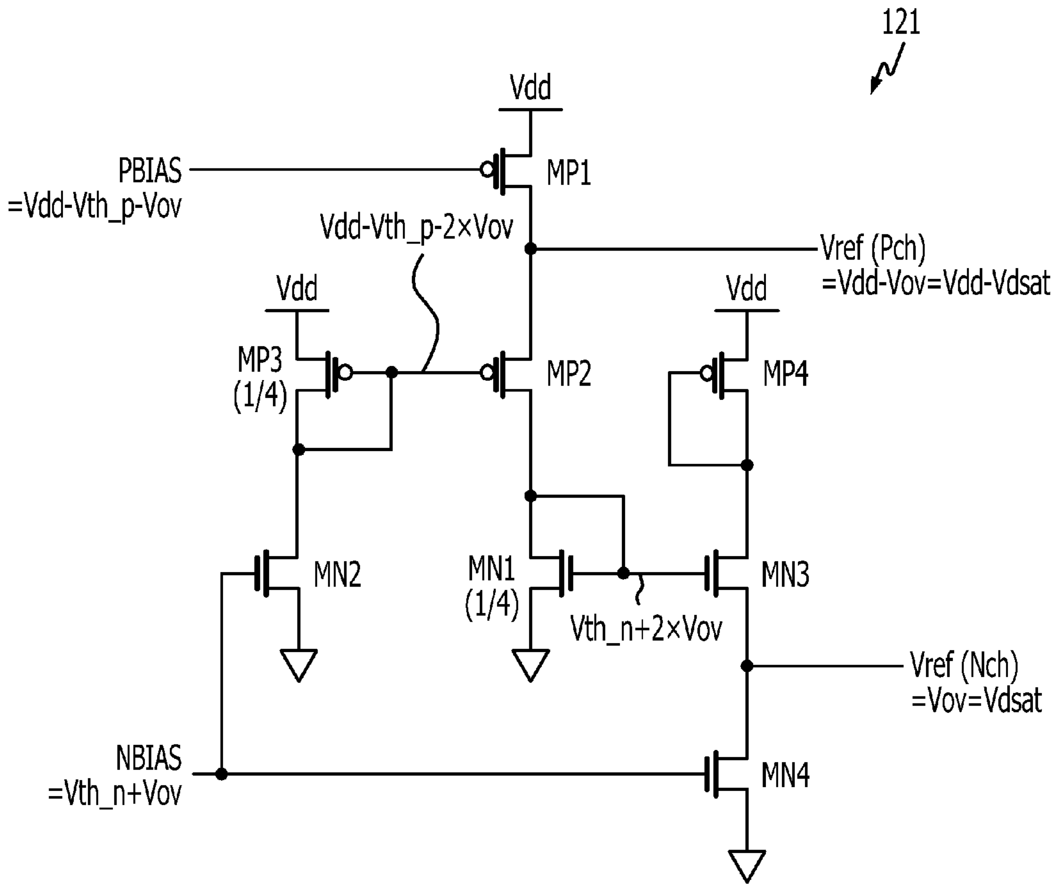
FIG. 8 illustrates a configuration of the reference saturation drain voltage generator circuit in the reference current generator circuit of the first embodiment.

The reference current generator circuit 100 desirably employs as the reference saturation drain voltage generator circuit 121 a circuit illustrated in FIG. 8.

FIG. 8 illustrates a configuration of the reference saturation drain voltage generator circuit 121 in the reference current generator circuit 100.

As illustrated in FIG. 8, the reference saturation drain voltage generator circuit 121 includes transistors MP1-MP4 and transistors MN1-MN4.

The transistors MP1-MP4 are PMOS transistors, and the transistors MN1-MN4 are NMOS transistors.

The bias voltage PBIAS is applied to the gate of the PMOS transistor MP1. The bias voltage NBIAS is applied to the gates of the NMOS transistors MN2 and MN4.

The bias voltages PBIAS and NBIAS are respectively identical to the bias voltages applied to the PMOS transistor 111 and the NMOS transistor 114 in the input-output unit 110. The bias voltages PBIAS and NBIAS are respectively applied via the output of the error amplifier 21 and the gate of the PMOS transistor 22 in the voltage-current converter circuit 20, and via the gate of the NMOS transistor 32 in the Pch-Nch converter circuit 30.

The bias voltage PBIAS is referred to (Vdd−Vth_p−Vov) and the bias voltage NBIAS is referred to (Vth_n+Vov), as Vth_p and Vth_n represent the threshold voltages of the PMOS transistor 111 and the NMOS transistor 114 respectively, and Vov(V overdrive) represents the overdrive voltage.

The PMOS transistor MP1 has the source thereof connected to the power source voltage Vdd, and the drain thereof connected to the source of the PMOS transistor MP2. As described above, the PMOS transistor MP1 has the gate thereof connected to the output of the error amplifier 21 and the gate of the PMOS transistor 22 in the voltage-current converter circuit 20, and receives at the gate thereof the bias voltage PBIAS (Vdd−Vth_p−Vov). The drain voltage of the PMOS transistor MP1 is output as the saturation drain voltage Vref(Pch) (=Vdd−Vdsat).

The PMOS transistor MP2 has the source thereof connected to the drain of the PMOS transistor MP1, the drain thereof connected to the drain of the NMOS transistor MN1, and the gate thereof connected to the gate of the PMOS transistor MP3. The PMOS transistor MP2 is cascode-connected to the PMOS transistor MP1, and is arranged to control fluctuations in the drain voltage of the PMOS transistor MP1.

The PMOS transistor MP3 has the source thereof connected to the power source voltage Vdd, the drain thereof connected to the drain of the NMOS transistor MN2, and the gate thereof connected to the gate of the PMOS transistor MP2. The gate of the PMOS transistor MP3 is connected to the drain thereof. The PMOS transistor MP3 is diode-connected between the power source voltage Vdd and the drain of the NMOS transistor MN2.

The gate width of the PMOS transistor MP3 is set to be ¼ of the gate width of each of the PMOS transistors MP1, MP2, and MP4. The PMOS transistor MP3 is identical to each of the PMOS transistors MP1, MP2, and MP4 in size other than the gate width size.

The PMOS transistor MP4 has the source thereof connected to the power source voltage Vdd, the drain thereof connected to the drain of the NMOS transistor MN3, and the gate thereof connected to the drain thereof. The PMOS transistor MP4 is diode-connected between the power source voltage Vdd and the drain of the NMOS transistor MN3.

The NMOS transistor MN1 has the drain thereof connected to the drain of the PMOS transistor MP2, the source thereof grounded, and the gate thereof connected to the gate of the NMOS transistor MN3. The NMOS transistor MN1 has the gate thereof connected to the drain thereof. The NMOS transistor MN1 is diode-connected between the drain of the PMOS transistor MP2 and the ground.

The gate width of the NMOS transistor MN1 is set to be ¼ of the gate width of each of the NMOS transistors MN2, MN3, and MN4. The NMOS transistor MN1 is identical to each of the NMOS transistors MN2, MN3, and MN4 in size other than the gate width size.

The NMOS transistor MN2 has the drain thereof connected to the drain of the PMOS transistor MP3, the source thereof grounded, and the gate thereof connected to the gate of the NMOS transistor 32 in the Pch-Nch converter circuit 30. The NMOS transistor MN2 receives at the gate thereof the bias voltage NBIAS (Vth_n+Vov).

The NMOS transistor MN3 has the drain thereof connected to the drain of the PMOS transistor MP4, the source thereof connected to the drain of the NMOS transistor MN4, and the gate thereof connected to the gate of the NMOS transistor MN1. The NMOS transistor MN3 is cascode-connected to the NMOS transistor MN4, and keeps fixed the drain voltage of the NMOS transistor MN4.

The NMOS transistor MN4 has the drain thereof connected to the source of the NMOS transistor MN3, the source thereof grounded, and the gate thereof connected to the gate of the NMOS transistor 32 in the Pch-Nch converter circuit 30.

The bias voltage PBIAS(Vdd−Vth_p−Vov) is applied to the gate of the PMOS transistor MP1 in the reference saturation drain voltage generator circuit 121 of FIG. 8. The drain voltage of the PMOS transistor MP1 is fixed by the PMOS transistor MP2 to Vdd−Vdsat. The reference saturation drain voltage generator circuit 121 outputs the drain voltage Vdd−Vdsat of the PMOS transistor MP1 as a saturation drain voltage Vref(Pch) to be applied to the inverting input terminal (−) of the comparator 122.

The NMOS transistor MN2 and the PMOS transistor MP3 generate the voltage to be applied to the gate of the PMOS transistor MP2 in accordance with the bias voltage NBIAS (Vth_n+Vov). Since the gate width of the PMOS transistor MP3 is set to be ¼ of the gate width of each of the PMOS transistors MP1, MP2, and MP4, the voltage output from the gate of the PMOS transistor MP3 is Vdd−Vthp−2×Vov.

The bias voltage NBIAS is applied to the gate of the NMOS transistor MN4, thereby restricting fluctuations in the drain voltage of the NMOS transistor MN3 cascode-connected to the NMOS transistor MN4. The drain voltage of the NMOS transistor MN4 is thus fixed to Vdsat. The drain voltage Vdsat of the NMOS transistor MN4 is applied to the inverting input terminal (−) of the comparator 123 as the reference saturation drain voltage Vref(Nch).

The NMOS transistor MN1 is positioned at the downstream side of the current path for generating the reference saturation drain voltage Vref(Pch)(=Vdd−Vdsat). Since the gate width of the NMOS transistor MN1 is set to be ¼ of the gate width of each of the NMOS transistors MN2, MN3, and MN4, the gate voltage of the NMOS transistor MN3 is Vth_n+2×Vov.

The circuit of FIG. 8 as the reference saturation drain voltage generator circuit 121 may generate the voltage Vdd−Vdsat and the voltage Vdsat at high precision.

The circuit of FIG. 8 includes the transistors MP1-MP4, and MN1-MN4 only. The use of the transistors having the same size as that of the PMOS transistor 111 and the NMOS transistor 114 used as the current source controls variations, particularly, chip-to-chip variations during manufacturing phase.

The circuit of FIG. 8 includes the transistors having the same size as that of the PMOS transistor 111 and the NMOS transistor 114 used as the current source, and generates the voltages Vdd−Vdsat and Vdsat in response to the bias voltages PBIAS and NBIAS output from the voltage-current converter circuit 20 and the Pch-Nch converter circuit 30.

Even if the reference current Iref generated by the voltage-current converter circuit 20 is modified, the voltages Vdd−Vdsat and Vdsat used as the reference saturation drain voltages Vref(Pch) and Vref(Nch) follow the modification.

The use of the transistors having the same size as that of the PMOS transistor 111 and the NMOS transistor 114 used as the current source allows the voltages Vdd−Vdsat and Vdsat to follow fluctuations in the power source voltage Vdd if the power source voltage Vdd fluctuates.

A process of the state machine 130 is described with reference to FIG. 9.

Figure 9:
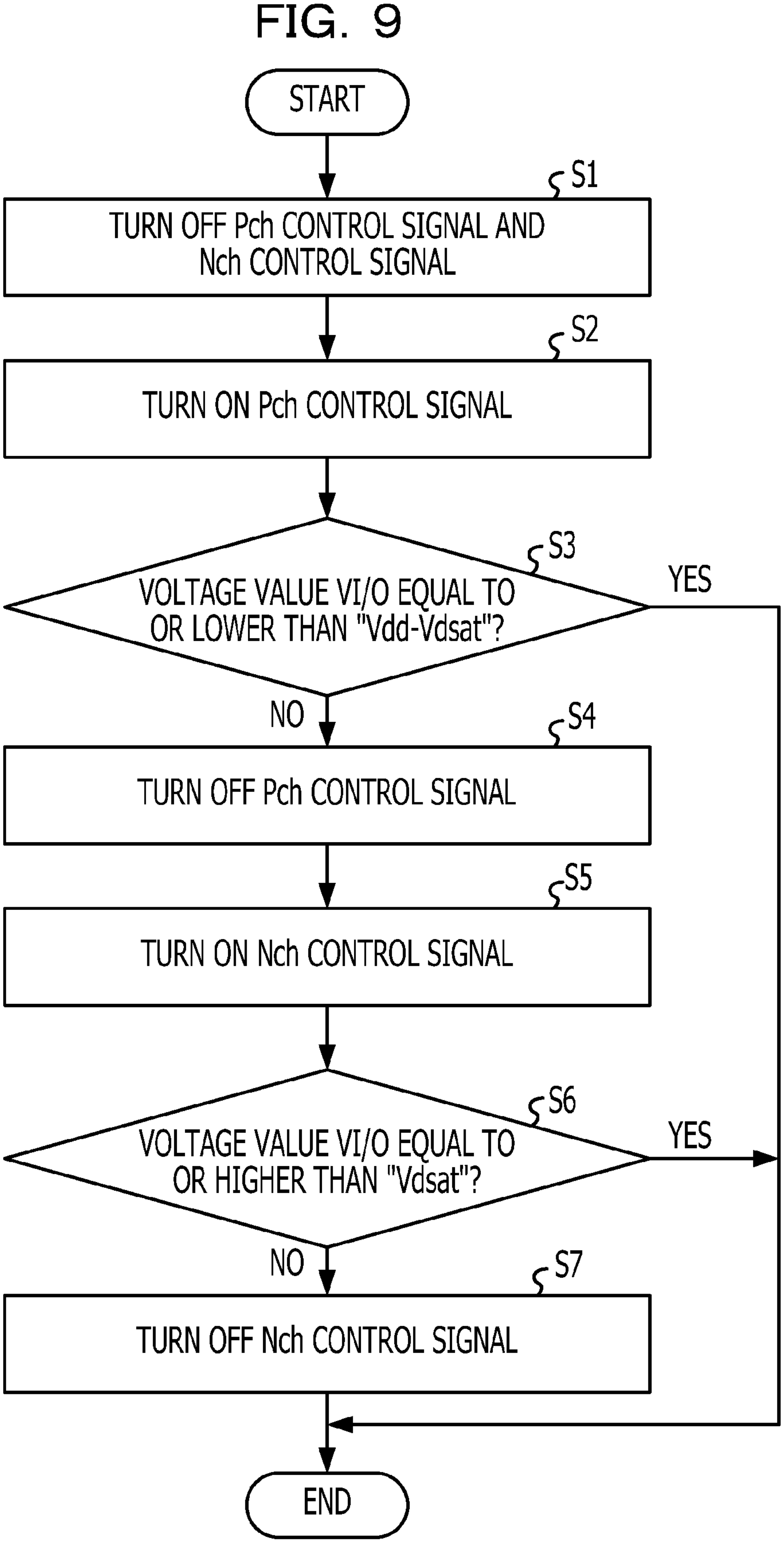
FIG. 9 is a flowchart of a process executed by a state machine in the reference current generator circuit of the first embodiment.

FIG. 9 illustrates a flowchart of the process of the state machine 130 in the reference current generator circuit 100.

The state machine 130 turns off the Pch control signal and the Nch control signal in response to the start of the process (S1). The state machine 130 is thus initialized with both the PMOS transistor 112 and the NMOS transistor 113 turned off. In this case, the Pch control signal is "1," and the Nch control signal is "0."

The state machine 130 turns on the Pch control signal (S2). More specifically, the state machine 130 sets the Nch control signal to "0" to turn on the PMOS transistor 112.

The state machine 130 determines the operative condition of the PMOS transistor 111, i.e., determines whether the voltage value $V_{I/O}$ at the input-output terminal 110A is equal to or lower than the output voltage Vdd−Vdsat (S3).

Upon determining that the voltage value $V_{I/O}$ at the input-output terminal 110A is equal to or lower than the output voltage Vdd−Vdsat (yes branch from S3), the state machine 130 terminates the process thereof.

In such a case, the current-sink type load circuit sinking the current thereto is connected to the input-output terminal 110A. If the load circuit sinking the current is connected to the input-output terminal 110A, a current path is formed from the PMOS transistor 111 to the load circuit via the PMOS transistor 112 and the input-output terminal 110A. The current path allows a current to flow, and the voltage value $V_{I/O}$ of the input-output terminal 110A becomes equal to or lower than Vdd−Vdsat.

Upon determining that the voltage value $V_{I/O}$ at the input-output terminal 110A is higher than the output voltage Vdd−Vdsat (no branch from S3), the state machine 130 turns off the Pch control signal (S4). The state machine 130 sets the Pch control signal to "1" to turn off the PMOS transistor 112.

This state is interpreted to mean that no load circuit is connected to the input-output terminal 110A or that a current-source type load circuit is connected to the input-output terminal 110A. In such a case, no current path is formed from the PMOS transistor 111 as the current source to the load circuit. The voltage value $V_{I/O}$ of the input-output terminal 110A remains equal to the power source voltage Vdd and is thus higher than Vdd−Vdsat.

The state machine 130 turns on the Nch control signal (S5). The state machine 130 sets the Nch control signal to "1" to turn on the NMOS transistor 113. In S5, the NMOS transistor 113 is turned on in a preparation operation to determine whether the current-source type load circuit has been connected to the input-output terminal 110A.

The state machine 130 determines the operative condition of the NMOS transistor 114, i.e., determines whether the voltage value $V_{I/O}$ of the input-output terminal 110A is equal to or higher than the output voltage Vdsat (S6). The state machine 130 thus determines whether the current-source type load circuit has been connected to the input-output terminal 110A.

Upon determining that the voltage value $V_{I/O}$ of the input-output terminal 110A is equal to or higher than the output voltage Vdsat (yes branch from S6), the state machine 130 ends the process thereof.

This state is interpreted to mean that the current-source type load circuit has been connected to the input-output terminal 110A. If the current-source type load circuit has been connected to the input-output terminal 110A, a current path is formed from the load circuit to the NMOS transistor 114 via the input-output terminal 110A and the NMOS transistor 113. The voltage value $V_{I/O}$ of the input-output terminal 110A becomes equal to or higher than Vdsat.

Upon determining that the voltage value $V_{I/O}$ of the input-output terminal 110A is lower than Vdsat (no branch from S6), the state machine 130 turns off the Nch control signal (S7).

This state is interpreted to mean that no load circuit is connected. In such a case, no current path is formed from the load circuit to the NMOS transistor 114 as the current source, and the voltage value $V_{I/O}$ of the input-output terminal 110A remains equal to the ground voltage.

If the state machine 130 terminates S7, the series of operations has been completed.

In the reference current generator circuit 100 of the first embodiment, the state machine 130 selects the current source in response to the voltage value $V_{I/O}$ of the input-output terminal 110A regardless of whether the input-output terminal 110A is connected to the current-sink type load circuit or the current-source type load circuit. The state machine 130 turns on one of the PMOS transistor 112 and the NMOS transistor 113 in response to the voltage value $V_{I/O}$ of the input-output terminal 110A, thereby selecting one of the PMOS transistor 111 and the NMOS transistor 114 as the current source.

The current path is thus formed by simply connecting the load circuit to the input-output terminal 110A of the input-output unit 110 regardless of whether the load circuit is the current-sink type or the current-source type. The load circuit is thus operated.

The output unit 40 in the reference current generator circuit 1 of FIG. 1 includes the circuit for the current-sink type load circuit and the circuit for the current-source type load circuit. The reference current generator circuit 100 of the first embodiment is free from such an arrangement of two circuits, and employs a common circuit used regardless of the direction of the current flowing through the load circuit.

If no load circuit is connected to the input-output terminal 110A, the PMOS transistor 111 and the NMOS transistor 114 remain turned off. No current flows through the input-output terminal 110A.

The use of the common circuit regardless of the direction of current allows the reference current generator circuit 100 to be treated easily as a black-box circuit, and a connection error to the load circuit is prevented.

The reference current generator circuit 100 is useful as an electronic circuit such as LSI, on which requirements of multi-type production and short-time circuit development are mounting.

As illustrated in FIG. 9, the state machine 130 determines whether the current-sink type load circuit has been connected to the input-output terminal 110A (S3). Upon determining that the current-sink type load circuit has not been connected (no branch from S3), the state machine 130 determines whether the current-source type load circuit has been connected to the input-output terminal 110A (S6).

The order of determination operations described above may be reversed. In other words, the state machine 130 determines whether the current-source type load circuit has been connected to the input-output terminal 110A. Upon determining that the current-source type load circuit has not been connected, the state machine 130 then determines whether the current-sink type load circuit has been connected to the input-output terminal 110A.

In the above discussion, the bias voltage generator unit includes the voltage-current converter circuit 20 and the Pch-Nch converter circuit 30. The bias voltage generator unit may be a circuit of FIG. 10.

Figure 10:
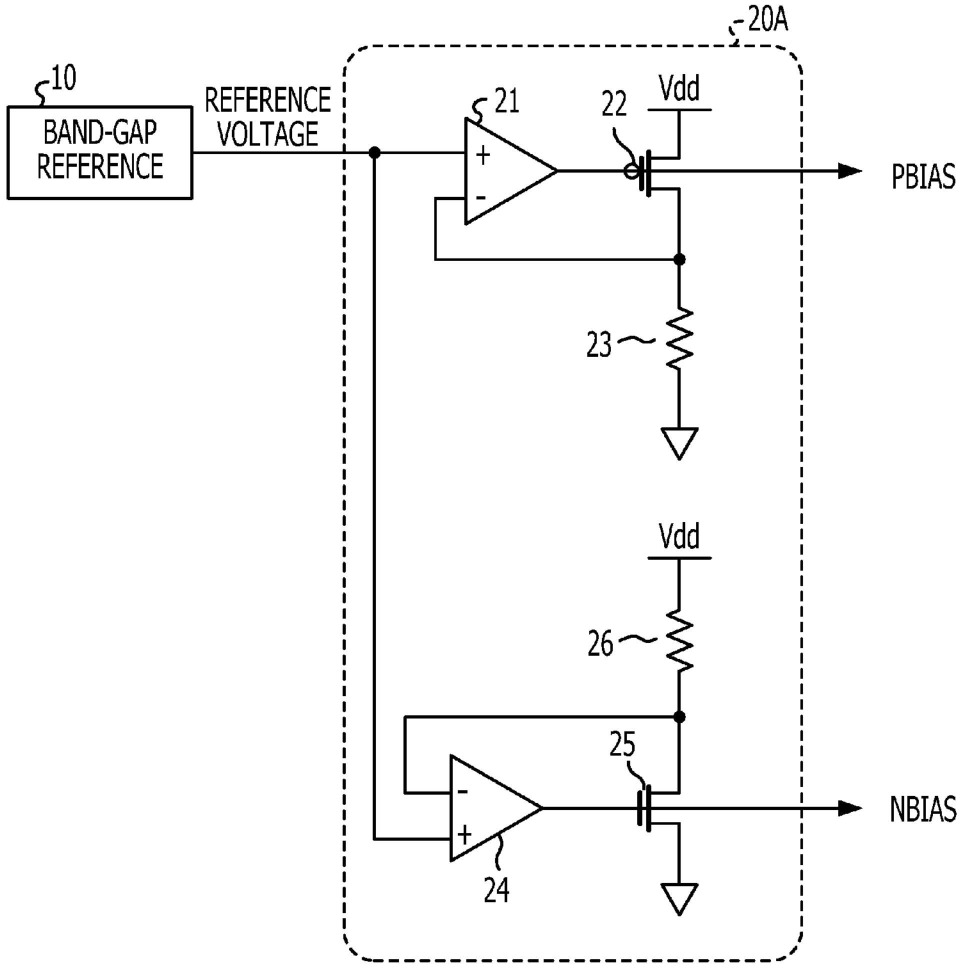
FIG. 10 illustrates a configuration of a bias voltage generator circuit in a reference current generator circuit as a modification of the first embodiment.

FIG. 10 illustrates a circuit configuration of the bias voltage generator unit included in the reference current generator circuit 100 of a modification of the embodiment.

The bias voltage generator unit 20A of FIG. 10 includes an error amplifier 24, an NMOS transistor 25, and a resistor 26 in addition to the error amplifier 21, the PMOS transistor 22, and the resistor 23.

The bias voltage generator unit 20A of FIG. 10 generates the bias voltage PBIAS and the bias voltage NBIAS. If the bias voltage generator unit 20A is used in the reference current generator circuit 100, the Pch-Nch converter circuit 30 of FIG. 4 becomes unnecessary.

The configuration and operation of the error amplifier 21, the PMOS transistor 22, and the resistor 23 remain unchanged from those of the error amplifier 21, the PMOS transistor 22, and the resistor 23 illustrated in FIG. 4. The bias voltage PBIAS output from the gate of the PMOS transistor 22 is input to the gate of the PMOS transistor 111 in the input-output unit 110 of FIG. 4. In FIG. 10, the PMOS transistor 22 is a first transistor of the first conductive type in the bias voltage generator unit. The error amplifier 21 is an example of a first error amplifier in the bias voltage generator unit, and the resistor 23 is an example of a first resistor in the bias voltage generator unit.

The error amplifier 24 has the non-inverting input terminal thereof connected to the reference voltage generator circuit 10, the output terminal thereof connected to the gate of the NMOS transistor 25, and the inverting input terminal thereof connected to the drain of the NMOS transistor 25 for negative feedback operation of the drain current of the NMOS transistor 25.

The NMOS transistor 25 has the gate thereof connected to the output terminal of the error amplifier 24, the source thereof grounded, and the drain thereof connected to the power source voltage Vdd via the resistor 26.

The resistor 26 is connected between the drain of the NMOS transistor 25 and the power source voltage Vdd.

The error amplifier 24 in the voltage-current converter circuit 20 compares the reference voltage input from the reference voltage generator circuit 10 with the voltage at the voltage the downstream end of the resistor 26, and drives the NMOS transistor 25 such that the voltage at the downstream end of the resistor 26 equals the reference voltage.

The gate voltage of the NMOS transistor 25 is directly output as the bias voltage NBIAS, and then input to the gate of the NMOS transistor 114 in the input-output unit 110 of FIG. 4. In FIG. 10, the NMOS transistor 25 is an example of a second transistor of the second conductive type in the bias voltage generator unit. The error amplifier 24 is an example of a second error amplifier in the bias voltage generator unit, and the resistor 26 is an example of a second resistor in the bias voltage generator unit.

Figure 11:
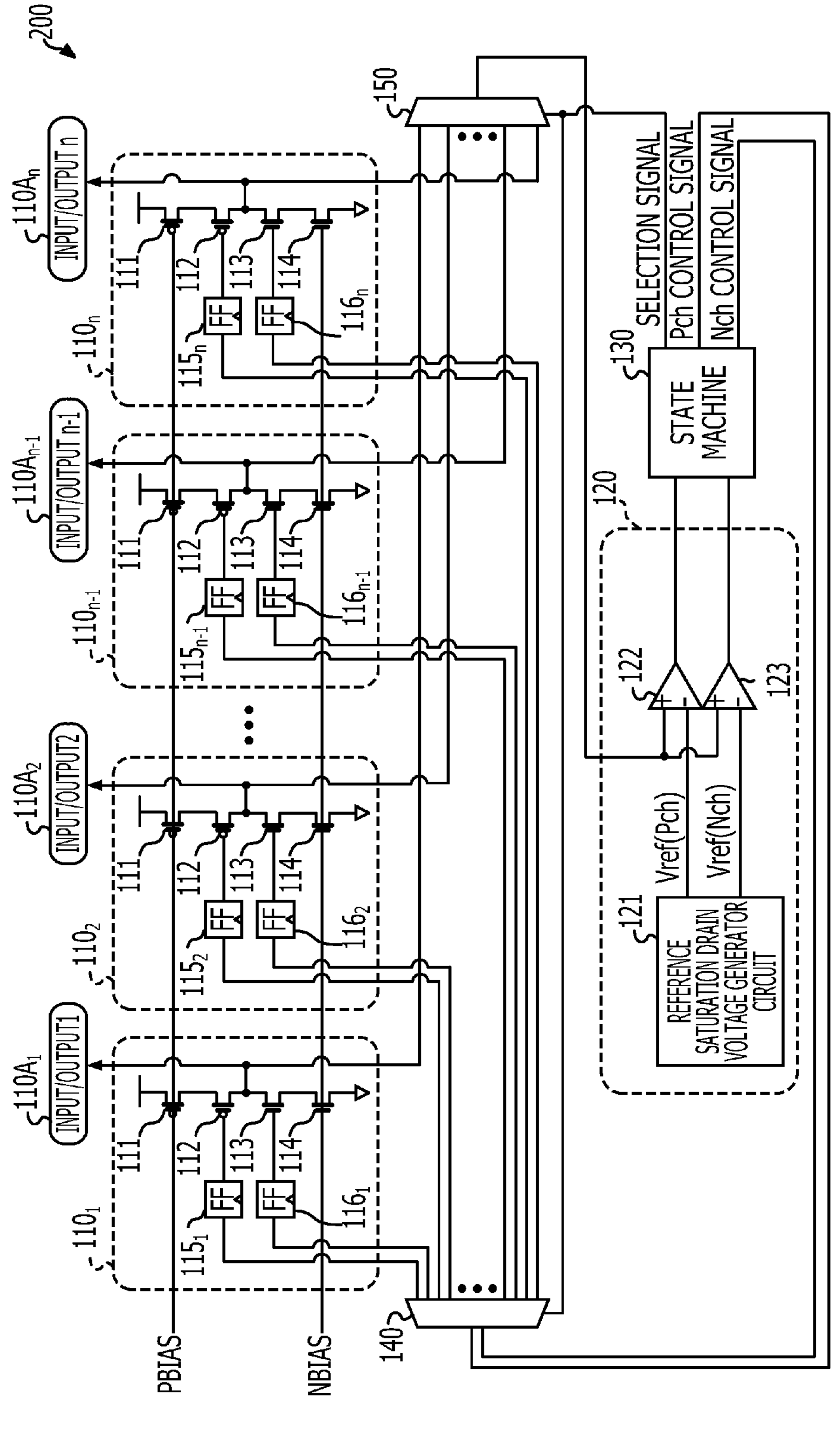
FIG. 11 illustrates a configuration of a reference current generator circuit of a second embodiment.

FIG. 11 illustrates a circuit configuration of a reference current generator circuit 200 of a second embodiment.

The reference current generator circuit 200 is different from the reference current generator circuit 100 of FIG. 4 in that the number of input-output units 110 is increased from one to n.

The reference current generator circuit 200 includes input-output units $\mathbf{110}_1$, $\mathbf{110}_2$, . . . , $\mathbf{110}_{n-1}$, and $\mathbf{110}_n$, demultiplexer 140, and multiplexer 150.

The reference voltage generator circuit 10, the voltage-current converter circuit 20, and the Pch-Nch converter circuit 30 are not illustrated in FIG. 11. The gates of the PMOS transistor 111 and the NMOS transistor 114 in each of the input-output units $\mathbf{110}_1$, $\mathbf{110}_2$, . . . , $\mathbf{110}_{n-1}$, and $\mathbf{110}_n$ are respectively connected to the output of the error amplifier 21 and the gate of the PMOS transistor 22 in the voltage-current converter circuit 20 and the gate of the NMOS transistor 32 in the Pch-Nch converter circuit 30.

The PMOS transistor 111 in each of the input-output units $\mathbf{110}_1$, $\mathbf{110}_2$, . . . , $\mathbf{110}_{n-1}$, and $\mathbf{110}_n$ receives at the gate thereof the bias voltage PBIAS from the output of the error amplifier 21 and the gate of the PMOS transistor 22 in the voltage-current converter circuit 20. The NMOS transistor 114 in each of the input-output units $\mathbf{110}_1$, $\mathbf{110}_2$, . . . , $\mathbf{110}_{n-1}$, and $\mathbf{110}_n$ receives at the gate thereof the bias voltage NBIAS from the gate of the NMOS transistor 32 in the Pch-Nch converter circuit 30.

In each of the input-output units $\mathbf{110}_1$, $\mathbf{110}_2$, . . . , $\mathbf{110}_{n-1}$, and $\mathbf{110}_n$, the PMOS transistor 111 and the NMOS transistor 114 respectively form current-mirror circuits with the PMOS transistor 22 in the voltage-current converter circuit 20 and the NMOS transistor 32 in the Pch-Nch converter circuit 30.

Connected to each of the input-output terminals $\mathbf{110A}_1$-$\mathbf{110A}_n$ of the input-output units $\mathbf{110}_1$-$\mathbf{110}_n$ is one of the current-sink type load circuit and the current-source type load circuit. The load circuits are not necessarily connected to all the input-output terminals $\mathbf{110A}_1$-$\mathbf{110A}_n$. Some of the input-output terminals $\mathbf{110A}_1$-$\mathbf{110A}_n$ may be left unconnected.

Each of the input-output units $\mathbf{110}_1$-$\mathbf{110}_n$ includes a pair of flipflop (FF) 115 and flip-flop (FF) 116. In each of the input-output units $\mathbf{110}_1$-$\mathbf{110}_n$, the output terminal of the FF 115 is connected to the gate of the PMOS transistor 112, and the output of the FF 116 is connected to the gate of the NMOS transistor 113.

The FF 115 in each of the input-output units $\mathbf{110}_1$-$\mathbf{110}_n$ retains the Pch control signal input from the state machine 130. Similarly, the FF 116 in each of the input-output units $\mathbf{110}_1$-$\mathbf{110}_n$ retains the Nch control signal input from the state machine 130.

Whether to turn on the PMOS transistor 112 or the NMOS transistor 113 in each of the input-output units $\mathbf{110}_1$-$\mathbf{110}_n$ is not yet decided in the initial state. Data "1" is set in the FF 115 and data "0" is set in the FF 116 in the initial state in order to turn off both the PMOS transistor 112 and the NMOS transistor 113.

The demultiplexer 140 is connected to each of the input terminals of the FFs 115 and 116 in each of the input-output units $\mathbf{110}_1$-$\mathbf{110}_n$.

The multiplexer 150 is connected to each of the input-output terminals $\mathbf{110A}_1$-$\mathbf{110A}_n$ of the input-output units $\mathbf{110}_1$-$\mathbf{110}_n$.

The demultiplexer 140 and the multiplexer 150 receive a selection signal from the state machine 130 in order to select one of the input-output units $\mathbf{110}_1$-$\mathbf{110}_n$. In order to select the n input-output units $\mathbf{110}_1$-$\mathbf{110}_n$ successively in order, the state machine 130 successively switches the selection signals.

If the demultiplexer 140 and the multiplexer 150 selects one of the input-output units $\mathbf{110}_1$-$\mathbf{110}_n$, the state machine 130 performs the same process as the process performed by the reference current generator circuit 100 as illustrated in FIG. 9 together with the selected input-output unit. The selection of one of the input-output units $\mathbf{110}_1$-$\mathbf{110}_n$ by the demultiplexer 140 and the multiplexer 150 is performed in response to the selection signal input to the demultiplexer 140 and the multiplexer 150. The selection signal specifies one of the input-output units $\mathbf{110}_1$-$\mathbf{110}_n$.

If the state machine 130 turns on the Pch control signal (S2 in FIG. 9), the demultiplexer 140 inputs the on Pch control signal to the gate of the PMOS transistor 112 via the FF 115 indicated by the input selection signal. If the state machine 130 turns on the Nch control signal (S5 in FIG. 9), the demultiplexer 140 inputs the on Nch control signal to the gate of the NMOS transistor 113 via the FF 116 indicated by the input selection signal.

The state machine 130 thus performs the same process as the process of FIG. 9, and one of the PMOS transistor 112 and the NMOS transistor 113 is turned on in response to the type of the load circuit.

To turn on the PMOS transistor 112, the on Pch control signal ("0") is set to the FF 115 and the off Nch control signal ("0") is set to the FF 116. To turn on the NMOS transistor 113, the off Pch control signal ("1") is set to the FF 115 and the on Nch control signal ("1") is set to the FF 116.

The state machine 130 in the reference current generator circuit 200 switches the selection signals successively such that the demultiplexer 140 selects the input-output unit receiving the Pch control signal/the Nch control signal from among the n input-output units $\mathbf{110}_1$-$\mathbf{110}_n$.

The multiplexer 150 supplies to the output voltage determining unit 120 the voltage $V_{I/O}$ output from one of the input-output units $\mathbf{110}_1$-$\mathbf{110}_n$ indicated by the selection signal. The output voltage determining unit 120 compares the reference voltage with the voltage $V_{I/O}$ of one of the input-output units $\mathbf{110}_1$-$\mathbf{110}_n$ indicated by the selection signal, and outputs one of the Pch control signal and the Nch control signal in response to the comparison results.

The FFs 115 and 116 in each of the input-output units $\mathbf{110}_1$-$\mathbf{110}_n$ respectively retain the Pch control signal and the Nch control signal set by the state machine 130.

The selection of one of the input-output units $\mathbf{110}_1$-$\mathbf{110}_n$ by the demultiplexer 140 and the multiplexer 150 may be performed such that one input-output unit is successively selected from among the input-output units $\mathbf{110}_1$-$\mathbf{110}_n$ in order. For example, the input-output units $110_1$-$110_n$ are selected one by one in that order.

If the load circuit is connected to each of the input-output terminals $110A_1$-$110A_n$ in the reference current generator circuit 200, the demultiplexer 140 and the multiplexer 150 selects the input-output units $110_1$-$110_n$ one by one successively.

The process of FIG. 9 is performed on each of the input-output units $110_1$-$110_n$. The bias voltage PBIAS and the bias voltage NBIAS are respectively set on the FFs 115 and 116 to turn on one of the NMOS transistor 112 and the NMOS transistor 113 depending on the type of each load circuit.

According to the second embodiment, the state machine 130 selects the current source in response to the voltage value $V_{I/O}$ of each of the input-output terminals $110A_1$-$110A_n$ regardless of whether the current-sink type load circuit or the current-source type load circuit is connected to each of the input-output terminals $110A_1$-$110A_n$. One of the PMOS transistor 111 and the NMOS transistor 114 is selected as the current source in response to the voltage value $V_{I/O}$ of each of the input-output terminals $110A_1$-$110A_n$.

A current path is established by simply connecting the load circuit to each of the input-output terminals $110A_1$-$110A_n$ of the input-output units $110_1$-$110_n$ without paying attention to whether the load circuit is a current-sink type load circuit and a current-source type load circuit. The load circuit is thus set to be operative.

Unlike the output unit 40 provided in the reference current generator circuit 1 of FIG. 1, the reference current generator circuit 200 of the second embodiment is free from the necessity of the circuit for the current-sink type load circuit and the circuit for the current-source type load circuit. The reference current generator circuit 200 has a common circuit design that works regardless of a difference in the direction of current.

Since the reference current generator circuit 200 has the common circuit design working regardless of a difference in the direction of current in the second embodiment, the reference current generator circuit 200 is treated easily as a black-box circuit. The reference current generator circuit 200 is thus free from a connection error of the load circuit.

The reference current generator circuit 200 is useful as an electronic circuit such as LSI, on which requirements of multi-type production and short-time circuit development are mounting.

A reference current generator circuit of a third embodiment is different from the reference current generator circuit 100 in terms of circuit configuration of the input-output unit 110. The rest of the configuration of the reference current generator circuit of the third embodiment remains unchanged from that of the reference current generator circuit 100. Like elements are designated with like reference numerals and the discussion thereof is omitted.

Figure 12:
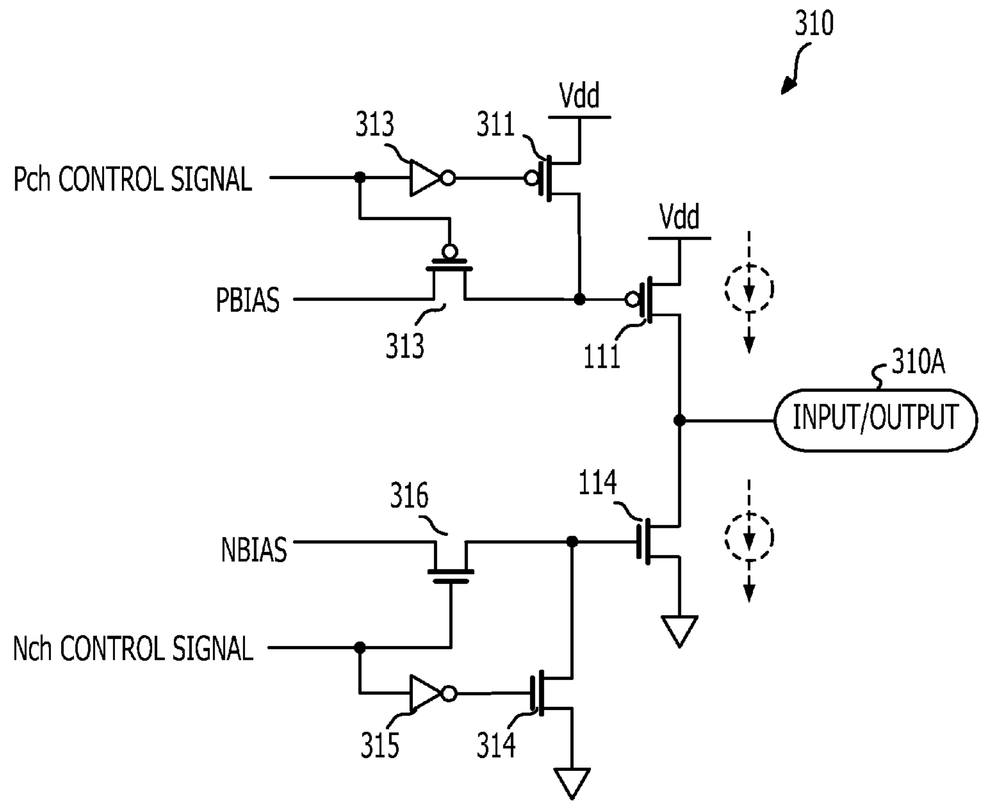
FIG. 12 illustrates an input-output circuit of a reference current generator circuit of a third embodiment.

FIG. 12 illustrates an input-output unit 310 of the reference current generator circuit of the third embodiment.

In the input-output unit 310 of the reference current generator circuit of the third embodiment, the PMOS transistor 111 and the NMOS transistor 114 are directly connected to each other between the power source voltage Vdd and the ground. An input-output terminal 310A of the input-output unit 310 is connected to the node of the drain of the PMOS transistor 111 and the drain of the NMOS transistor 114.

As the PMOS transistor 111 of the first embodiment, the PMOS transistor 111 of FIG. 12 is a sourcing current source that supplies a current to the load circuit to sink current. As the NMOS transistor 114 of the first embodiment, the NMOS transistor 114 of FIG. 12 is a sinking current source that sinks a current from the load circuit. The PMOS transistor 111 and the NMOS transistor 114 are labeled current source symbols close thereto.

The PMOS transistor 111 has the gate thereof connected to the drain of a PMOS transistor 311 and the drain of a PMOS transistor 313.

The PMOS transistor 311 has the source thereof connected to the power source voltage Vdd, the drain thereof connected to the gate of the PMOS transistor 111 and the source of the PMOS transistor 313, and the gate thereof connected to the output terminal of an inverter 312.

The inverter 312 has the input terminal thereof connected to the state machine 130 of FIG. 4 and the gate of the PMOS transistor 313, and the output terminal thereof connected to the gate of the PMOS transistor 311. The Pch control signal from the state machine 130 is input to the input terminal of the inverter 312.

The PMOS transistor 313 has the source thereof connected to the gate of the PMOS transistor 111 and the drain of the PMOS transistor 311, the drain thereof connected to the output of the error amplifier 21 and the gate of the PMOS transistor 22 in the voltage-current converter circuit 20, and the gate thereof connected to the input terminal of the inverter 312 and the state machine 130.

The PMOS transistor 313 receives at the drain thereof the bias voltage PBIAS from the output of the error amplifier 21 and the gate of the PMOS transistor 22 in the voltage-current converter circuit 20. The PMOS transistor 313 receives at the gate thereof the Pch control signal from the state machine 130.

The NMOS transistor 114 has the gate thereof connected to the drain of an NMOS transistor 314 and the source of an NMOS transistor 316.

The NMOS transistor 314 has the source thereof grounded, the drain thereof connected to the gate of the NMOS transistor 114 and the source of the NMOS transistor 316, and the gate thereof connected to the output terminal of an inverter 315.

The inverter 315 has the input terminal thereof connected to the gate of the NMOS transistor 316 and the state machine 130, and the output terminal thereof connected to the gate of the NMOS transistor 314. The inverter 315 receives at the input terminal thereof the Nch control signal from the state machine 130.

The NMOS transistor 316 has the source thereof connected to the gate of the NMOS transistor 114 and the drain of the NMOS transistor 314, the drain thereof connected to the gate of the NMOS transistor 32 in the Pch-Nch converter circuit 30, and the gate thereof connected to the input terminal of the inverter 315 and the state machine 130.

The NMOS transistor 316 receives at the drain thereof the bias voltage NBIAS from the gate of the NMOS transistor 32 in the Pch-Nch converter circuit 30. The NMOS transistor 316 receives at the gate thereof the Nch control signal from the state machine 130.

In the input-output unit 310 in the initial state, the bias voltages PBIAS and NBIAS are continuously supplied from the voltage-current converter circuit 20 and the Pch-Nch converter circuit 30 to the drain of the PMOS transistor 313 and the drain of the NMOS transistor 316, respectively.

The Pch control signal input from the state machine 130 to the input terminal of the inverter 312 and the gate of the PMOS transistor 313 is off ("1") in the initial state.

The inverter 312 outputs "0," turning on the PMOS transistor 311. The PMOS transistor 111 is turned off. The PMOS transistor 313 is turned off.

The Nch control signal input from the state machine 130 to the input terminal of the inverter 315 and the gate of the NMOS transistor 316 is off ("0") in the initial state.

The inverter 315 outputs "1," turning on the NMOS transistor 314. The NMOS transistor 114 is turned off. The NMOS transistor 316 is turned off.

If the Pch control signal is turned on ("0"), the inverter 312 outputs "1," thereby turning off the PMOS transistor 311. The PMOS transistor 313 is turned on. The bias voltage PBIAS is input to the gate of the PMOS transistor 111, thereby turning on the PMOS transistor 111.

If the Nch control signal is turned on ("1"), the inverter 315 outputs "0," thereby turning off the NMOS transistor 314. The NMOS transistor 316 is turned on. The bias voltage NBIAS is input to the gate of the NMOS transistor 114, thereby turning on the NMOS transistor 114.

As the input-output unit 110, the input-output unit 310 on-off controls the PMOS transistor 111 and the NMOS transistor 114 in response to the Pch control signal and the Nch control signal input from the state machine 130.

The reference current generator circuit of the third embodiment employs the input-output unit 310 instead of the input-output unit 110. As the reference current generator circuit 100 of the first embodiment, the reference current generator circuit of the third embodiment forms the current path regardless of whether a current-sink type or a current-source type is connected to the input-output terminal 310A. The load circuit is thus operated.

Unlike the output unit 40 provided in the reference current generator circuit 1 of FIG. 1, the reference current generator circuit of the third embodiment is free from the necessity of the circuit for the current-sink type load circuit and the circuit for the current-source type load circuit. The reference current generator circuit has a common design that works regardless of a difference in the direction of current.

Since the reference current generator circuit has the common circuit design working regardless of a difference in the direction of current in the third embodiment, the reference current generator circuit is treated easily as a black-box circuit. The reference current generator circuit is thus free from a connection error of the load circuit.

The reference current generator circuit of the third embodiment is useful as an electronic circuit such as LSI, on which requirements of multi-type production and short-time circuit development are mounting.

The input-output unit 310 may be incorporated in the reference current generator circuit 200 of the second embodiment.

A reference current generator circuit of a fourth embodiment is different from the reference current generator circuit of the third embodiment in that an input-output unit is cascode-connected and that a reference saturation drain voltage generator circuit is also cascode-connected. The rest of the configuration of the reference current generator circuit of the fourth embodiment remains unchanged from the reference current generator circuit of the third embodiment. Like elements are designated with like reference numerals, and the discussion thereof is omitted.

An input-output unit of the reference current generator circuit of the fourth embodiment is described with reference to FIG. 13.

As in the first embodiment, an input-output circuit 410 of the reference current generator circuit of the fourth embodiment is cascode-connected between the power source voltage Vdd and ground. The input-output circuit 410 includes the PMOS transistor 111, the PMOS transistor 112, the NMOS transistor 113, and the NMOS transistor 114.

An input-output terminal 410A of the input-output circuit 410 is connected to the node of the drain of the PMOS transistor 112 and the drain of the NMOS transistor 113.

As in the first embodiment, the PMOS transistor 111 receives at the gate thereof the bias voltage PBIAS from the output of the error amplifier 21 and the gate of the PMOS transistor 22 in the voltage-current converter circuit 20.

The PMOS transistor 112 has the gate thereof connected to the drain of a PMOS transistor 411 and the source of a PMOS transistor 413.

The PMOS transistor 411 has the source thereof connected to the power source voltage Vdd, the drain thereof connected to the gate of the PMOS transistor 112, and the source of the PMOS transistor 413, and the gate thereof connected to the output terminal of an inverter 412.

The inverter 412 has the input terminal thereof connected to the state machine 130 of FIG. 4 and the gate of the PMOS transistor 413, and the output terminal thereof connected to the gate of the PMOS transistor 411. The inverter 412 receives at the gate thereof the Pch control signal from the state machine 130.

The PMOS transistor 413 has the source thereof connected to the gate of the PMOS transistor 112 and the drain of the PMOS transistor 411, the drain thereof receiving a bias voltage PBIASC, and the gate thereof connected to the input terminal of the inverter 412 and the state machine 130.

In the fourth embodiment, the PMOS transistor 112 is cascode-connected to the PMOS transistor 111 of the third embodiment such that the drain voltage of the PMOS transistor 111 is fixed.

The bias voltage PBIASC is a bias voltage that turns on/off the gate of the PMOS transistor 112 cascode-connected to the PMOS transistor 111. The bias voltage PBIASC may be generated using a reference voltage generator circuit different from the reference voltage generator circuit 10 of FIG. 4.

The NMOS transistor 114 receives at the gate thereof the bias voltage NBIAS from the gate of the NMOS transistor 32 in the Pch-Nch converter circuit 30.

The NMOS transistor 113 has the gate thereof connected to the drain of an NMOS transistor 414 and the source of an NMOS transistor 416.

The NMOS transistor 414 has the source thereof grounded, the drain thereof connected to the gate of the NMOS transistor 113 and the source of the NMOS transistor 416, and the gate thereof connected to the output terminal of an inverter 415.

The inverter 415 has the input terminal thereof connected to the gate of the NMOS transistor 416 and the state machine 130, and the output terminal thereof connected to the gate of the NMOS transistor 414. The inverter 415 receives at the input terminal thereof the Nch control signal from the state machine 130.

The NMOS transistor 416 has the source thereof connected to the gate of the NMOS transistor 113 and the drain of the NMOS transistor 414, the drain thereof receiving a bias voltage NBIASC, and the gate thereof connected to the input terminal of the inverter 415 and the state machine 130.

In the fourth embodiment, the NMOS transistor 113 is cascode-connected to the NMOS transistor 114 to fix the drain voltage of the NMOS transistor 114.

The NMOS transistor 416 receives at the drain thereof the bias voltage NBIASC. The NMOS transistor 416 receives at the gate thereof the Nch control signal from the state machine 130.

The bias voltage NBIASC is a bias voltage that turns on/off the gate of the NMOS transistor 113 cascode-connected to the NMOS transistor 114. As the bias voltage PBIASC, the bias voltage NBIASC may be generated by the reference voltage generator circuit different from the reference voltage generator circuit 10 of FIG. 4.

In the input-output circuit 410 in the initial state, the bias voltages PBIAS and NBIAS are continuously supplied from the voltage-current converter circuit 20 and the Pch-Nch converter circuit 30 to the gate of the PMOS transistor 111 and the gate of the NMOS transistor 114, respectively.

In the initial state, the bias voltage PBIASC is input to the drain of the PMOS transistor 413, and the bias voltage NBIASC is input to the drain of the NMOS transistor 416.

The Pch control signal input from the state machine 130 to the input terminal of the inverter 412 and the gate of the PMOS transistor 413 is off ("1") in the initial state.

The inverter 412 outputs "0," thereby turning on the PMOS transistor 411. The PMOS transistor 112 is turned off. The PMOS transistor 413 is turned off.

The Nch control signal input from the state machine 130 to the input terminal of the inverter 415 and the gate of the NMOS transistor 416 is off ("0") in the initial state.

The inverter 415 outputs "1," thereby turning on the NMOS transistor 414. The NMOS transistor 113 is turned off. The NMOS transistor 416 is turned off.

If the Pch control signal is turned on ("0"), the inverter 412 outputs "1," turning off the PMOS transistor 411. The PMOS transistor 413 is turned on. The bias voltage PBIASC is input to the gate of the PMOS transistor 112, thereby turning on the PMOS transistor 112. The PMOS transistor 111 thus feeds a current to the input-output terminal 410A.

If the Nch control signal is turned on ("1"), the inverter 415 outputs "0," turning off the NMOS transistor 414. The NMOS transistor 416 is turned on. The bias voltage PBIASC is input to the gate of the NMOS transistor 113, thereby turning on the NMOS transistor 113. The NMOS transistor 114 thus drains a current from the input-output terminal 410A.

As the input-output unit 110 of the first embodiment, the input-output circuit 410 turns on/off the PMOS transistor 111 and the NMOS transistor 114 in response to the Pch control signal and the Nch control signal input from the state machine 130.

The reference current generator circuit of the fourth embodiment employs the input-output unit 410 instead of the input-output unit 110. As the reference current generator circuit 100 of the first embodiment, the reference current generator circuit of the fourth embodiment forms the current path regardless of whether a current-sink type or a current-source type is connected to the input-output terminal 410A. The load circuit is thus operated.

A reference saturation drain voltage generator circuit 421 is described with reference to FIG. 14. The reference saturation drain voltage generator circuit 421 of FIG. 14 is used together with the input-output circuit 410 of FIG. 13.

Figure 14:
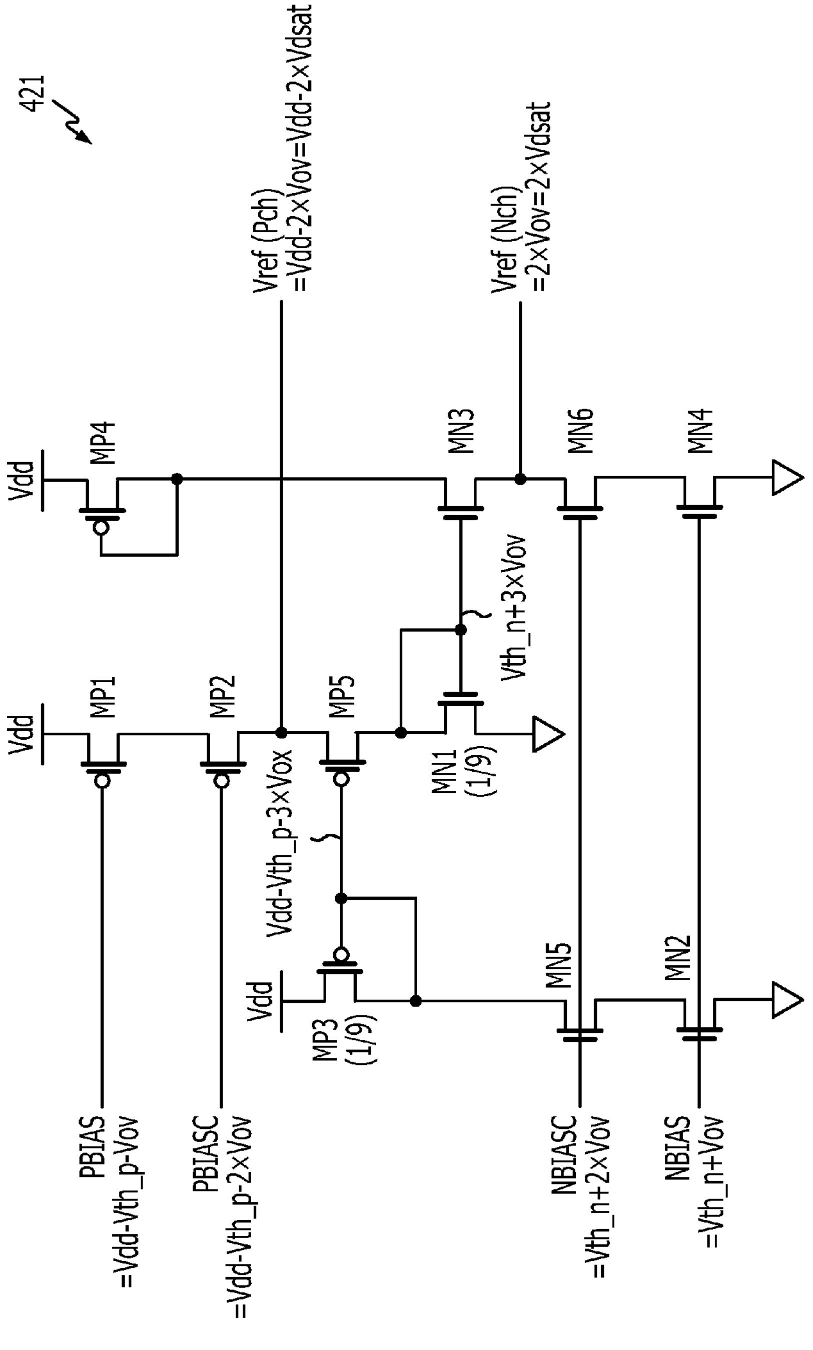
FIG. 14 illustrates a configuration of a reference saturation drain voltage generator circuit in a reference current generator circuit of a fourth embodiment.

As illustrated in FIG. 14, the reference saturation drain voltage generator circuit 421 includes transistors MP1-MP5 and transistors MN1-MN6.

MP1-MP5 are PMOS transistors and MN1-MN6 are NMOS transistors.

The PMOS transistor MP1 receives at the gate thereof the bias voltage PBIAS and the NMOS transistors MN2 and MN4 receive at the gates thereof the bias voltage NBIAS.

The bias voltages PBIAS and NBIAS are respectively common to the bias voltages applied to the PMOS transistor 111 and the NMOS transistor 114 in the input-output circuit 410. The bias voltage PBIAS is supplied via the output of the error amplifier 21 and the gate of the PMOS transistor 22 in the voltage-current converter circuit 20 and the bias voltage NBIAS is supplied via the gate of the NMOS transistor 32 in the Pch-Nch converter circuit 30.

Let Vth_p and Vth_n represent the threshold voltages of the PMOS transistor 111 and the NMOS transistor 114, and let Vov(Voverdrive) represent the overdrive voltage, and the bias voltage PBIAS is (Vdd−Vth_p−Vov), and the bias voltage NBIAS is (Vth_n+Vov).

The PMOS transistor MP1 has the source thereof connected to the power source voltage Vdd, and the drain thereof connected to the source of the MP2. The PMOS transistor MP1 has the gate thereof connected to the output of the error amplifier 21 and the gate of the PMOS transistor 22 in the voltage-current converter circuit 20. The PMOS transistor MP1 receives at the gate thereof the bias voltage PBIAS (Vdd−Vth_p−Vov).

The PMOS transistor MP2, cascode-connected to the PMOS transistor MP1, has the source thereof connected to the drain of the PMOS transistor MP1, the drain thereof connected to the source of PMOS transistor MP5, and the gate thereof receiving the bias voltage PBIASC.

The PMOS transistor MP2 outputs as the drain voltage the saturation drain voltage Vref(Pch)(=Vdd−2×Vov=Vdd−2×Vdsat).

Figure 13:
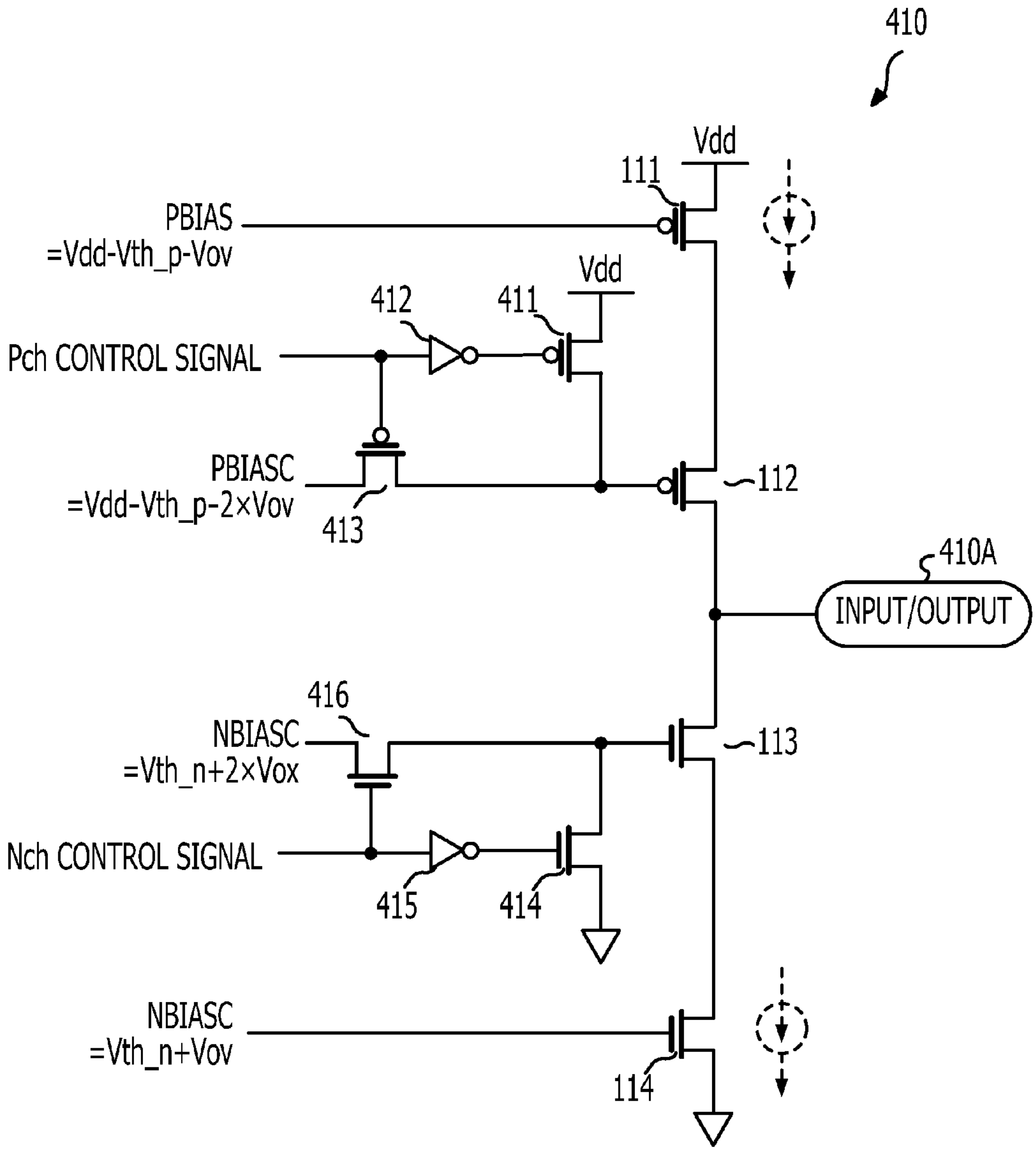
FIG. 13 illustrates an input-output circuit of a reference current generator circuit of the third embodiment.

The bias voltage PBIASC equals the same bias voltage PBIASC as the bias voltage to be input to the drain of the PMOS transistor 413 of FIG. 13, and is supplied from the same reference voltage generator circuit.

The PMOS transistor MP5 has the source thereof connected to the drain of the PMOS transistor MP2, the drain thereof connected to the drain of the NMOS transistor MN1, and the gate thereof connected to the gate of the PMOS transistor MP3. The PMOS transistor MP5 is cascode-connected to the PMOS transistor MP2, and is intended to control fluctuations in the drain voltage of the PMOS transistor MP2.

The PMOS transistor MP3 has the source thereof connected to the power source voltage Vdd, the drain thereof connected to the drain of the NMOS transistor MN5, and the gate thereof connected to the gate of the PMOS transistor MP5. The PMOS transistor MP3 has the gate thereof connected to the drain thereof, and is thus diode-connected between the power source voltage Vdd and the drain of the NMOS transistor MN5.

The gate width of the PMOS transistor MP3 is set to be ⅑ of the gate width of each of the PMOS transistors MP1, MP2, MP4, and MP5. The PMOS transistor MP3 is identical to each of the PMOS transistors MP1, MP2, MP4, and MP5 in size other than the gate width size.

The PMOS transistor MP4 has the source thereof connected to the power source voltage Vdd, the drain thereof connected to the drain of the NMOS transistor MN3, and the gate thereof connected to the drain thereof. More specifically, the PMOS transistor MP4 is diode-connected between the power source voltage Vdd and the drain of the NMOS transistor MN3.

The NMOS transistor MN1 has the drain thereof connected to the drain of the PMOS transistor MP5, the source thereof grounded, and the gate thereof connected to the gate of the NMOS transistor MN3. The NMOS transistor MN1 has the drain thereof connected to the gate thereof. More specifically, the NMOS transistor MN1 is diode-connected between the drain of the PMOS transistor MP5 and the ground.

The gate width of the NMOS transistor MN1 is set to be ⅑ of the gate width of each of the NMOS transistors MN2-MN6. The NMOS transistor MN1 is identical to each of the NMOS transistors MN2-MN6 in size other than the gate width size.

The NMOS transistor MN2 has the drain thereof connected to the source of the NMOS transistor MN5, the source thereof grounded, and the gate thereof connected to the gate of the NMOS transistor 32 in the Pch-Nch converter circuit 30. The NMOS transistor MN2 receives at the gate thereof the bias voltage NBIAS(Vth_n+Vov).

The NMOS transistor MN3 has the drain thereof connected to the drain of the PMOS transistor MP4, the source thereof connected to the drain of the NMOS transistor MN6, and the gate thereof connected to the gate of the NMOS transistor MN1. The NMOS transistor MN3 is cascode-connected to the NMOS transistor MN6.

The NMOS transistor MN4 has the drain thereof connected to the source of the NMOS transistor MN6, the source thereof grounded, and the gate thereof connected to the gate of the NMOS transistor 32 in the Pch-Nch converter circuit 30.

The NMOS transistor MN5 has the drain thereof connected to the drain of the PMOS transistor MP3, the source thereof connected to the drain of the NMOS transistor MN2, and the gate thereof receiving the bias voltage NBIASC. The NMOS transistor MN5 is cascode-connected to the NMOS transistor MN2, and is intended to fix the drain voltage of the NMOS transistor MN2.

The NMOS transistor MN6 has the drain thereof connected to the source of the NMOS transistor MN3, the source thereof connected to the drain of the NMOS transistor MN4, and the gate thereof receiving the bias voltage NBIASC. The NMOS transistor MN6 is cascode-connected to the NMOS transistor MN4, and is intended to fix the drain voltage of the NMOS transistor MN4.

The bias voltage NBIASC input to the gates of the NMOS transistors MN5 and MN6 equals the bias voltage NBIASC input to the drain of the NMOS transistor 416 of FIG. 13, and may be supplied from the same reference voltage generator circuit.

In the first embodiment, the size of the transistors MP3 and MN1 is set to be ¼ of the size of the other transistors. In this way, the bias voltage supplied to the gate of the PMOS transistor MP2 and the bias voltage supplied to the gate of the NMOS transistor MN3 are respectively set to be Vdd−Vth_p−2Vov and Vth_n+2×Vov.

In contrast in the fourth embodiment, the size of the transistors MP3 and MN1 is set to be 1/9 of the size of the other transistors. In this way, the bias voltage supplied to the gate of the PMOS transistor MP5 and the bias voltage supplied to the gate of the NMOS transistor MN3 are respectively set to be Vdd−Vth_p−3Vov and Vth_n+3×Vov.

Since the size of the transistors MP3 and MN1 is set to be 1/9 of the size of the other transistors, the transistor cascode connection is implemented in the reference saturation drain voltage generator circuit 421 of FIG. 14. The reference saturation drain voltage generator circuit 421 thus operates in a reliable fashion.

The transistors MP1, MP2, MP5, and MN1 have the overdrive voltage Vov. The power source voltage is at least Vth_n+3×Vov+3×Vov=Vth_n+6×Vov in order to cause the reference saturation drain voltage generator circuit 421 to operate in a reliable fashion.

Figure 15:
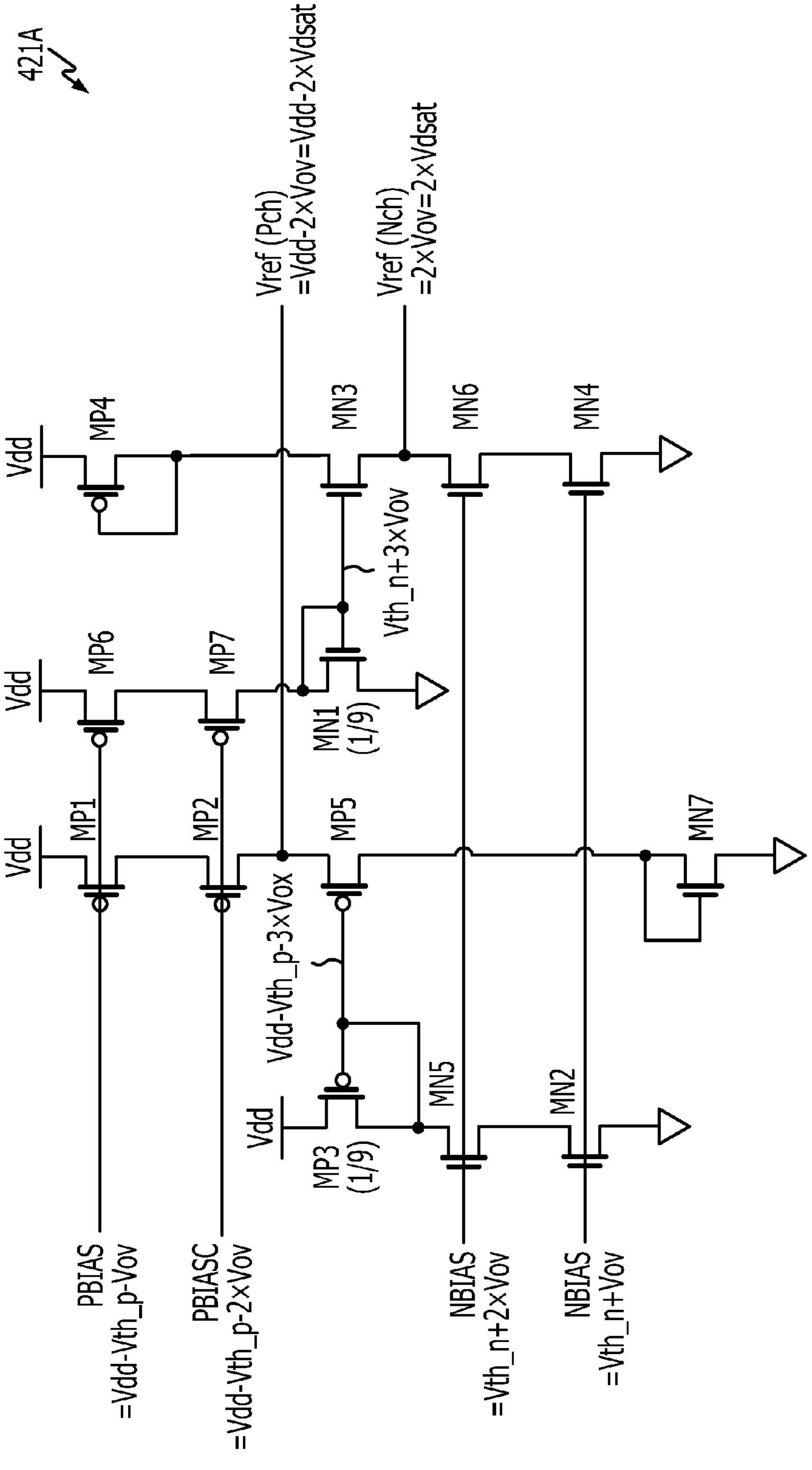
FIG. 15 illustrates a configuration of the reference saturation drain voltage generator circuit in the reference current generator circuit of the fourth embodiment.

If there is a possibility that the power source voltage becomes insufficient, a reference saturation drain voltage generator circuit 421A operating at a lower voltage illustrated in FIG. 15 may be used.

FIG. 15 illustrates a circuit configuration of the reference saturation drain voltage generator circuit 421A in the reference voltage generator circuit of the fourth embodiment.

The reference saturation drain voltage generator circuit 421A of FIG. 15 includes transistors MP6, MP7, and MN7 added to the reference saturation drain voltage generator circuit 421. The reference saturation drain voltage generator circuit 421A thus splits the current path between the PMOS transistor MP5 and the NMOS transistor MN1 illustrated in FIG. 14.

The difference between the reference saturation drain voltage generator circuit 421 of FIG. 14 and the reference saturation drain voltage generator circuit 421A of FIG. 15 is described below.

The gates of the PMOS transistor MP6 and the PMOS transistor MP7 are respectively connected to the gates of the PMOS transistors MP1 and MP2. Currents flowing through PMOS transistors MP6 and MP7 are the same currents as the currents respectively flowing through the PMOS transistors MP1 and MP2.

The NMOS transistor MN7 is diode-connected to the drain of the PMOS transistor MP5.

The NMOS transistor MN7 has the gate thereof connected to the drain thereof, and thus serves as a diode. The source of the NMOS transistor MN7 is grounded.

In the reference saturation drain voltage generator circuit 421A of FIG. 15, the NMOS transistor MN1 generating the bias voltage Vth_n+3×Vov illustrated in FIG. 14 is connected to a current path routing through the PMOS transistors MP6 and MP7 rather than the PMOS transistor MP5. This arrangement reduces the number of transistors arranged between the power source voltage Vdd and the ground by one. The minimum operating voltage is thus reduced to Vth_n+3×Vov+2×Vov=Vth_n+5×Vov.

The reference current generator circuits of the embodiments of the invention and the information processing apparatus including the reference current generator circuit have been discussed. The invention is not limited to the embodiments discussed herein, and a variety of changes and modifications are possible without departing from the scope of the claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A reference current generating circuit comprising:

a reference voltage generating unit that generates a reference voltage;

a bias voltage generating unit that includes a first transistor of a first conductive type and a second transistor of a second conductive type that each output a reference current based on the reference voltage and generate a first bias voltage and a second bias voltage, respectively;

a first output transistor of a first conductive type that outputs a current corresponding to a reference current when the first bias voltage is supplied to a control terminal of the first output transistor:

a second output transistor of a second conductive type that outputs a current corresponding to a reference current when the second bias voltage is supplied to a control terminal of the second output transistor;

an input-output unit in which one terminal thereof is connected between an output terminal of the first output transistor and an input terminal of the second output transistor and the other terminal is connected to a load circuit, the input-output unit supplying current from the first output transistor to the load circuit or supplying current from the load circuit to the second output transistor; and a switching control unit that outputs a control signal to the input-output unit to turn on or off the first output transistor and the second output transistor based on voltage of an output from the input-output unit, wherein the switching control unit includes:

a saturation voltage generating circuit that generates a first reference voltage that serves as a boundary between a saturation region of the first transistor and a non-saturation region of the first transistor, and generates a second reference voltage that serves as a boundary between a saturation region of the second transistor and a non-saturation region of the second transistor, based on the first bias voltage and the second bias voltage;

a first comparator that compares the output voltage of the input-output unit and the first reference voltage;

a second comparator that compares the output voltage of the input-output unit and the second reference voltage; and a state machine that switches a connection condition of a first switching element of the input-output unit and a second switching element of the input-output unit based on a result of comparison by the first comparator and the second comparator.

2. The reference current generating circuit according to claim 1, wherein the first switching element is connected between an output terminal of the first output transistor and the input-output unit and switches a connection of the output terminal of the first output transistor and the input-output unit; and the second switching element is connected between an output terminal of the second output transistor and the input-output unit and switches a connection of the output terminal of the second output transistor and the input-output unit, wherein the switching control unit turns on and off the first output transistor and the second output transistor by switching a connection condition of the first switching element and the second switching element based on the output voltage of the input-output unit.

3. The reference current generating circuit according to claim 1, wherein the first switching element is connected between the control terminal of the first output transistor and the bias voltage generating unit and switches a connection between the first output transistor and the bias voltage generating unit; and the second switching element is connected between the control terminal of the second output terminal and the bias voltage generating unit and switches a connection between the second output transistor and the bias voltage generating unit, wherein the switching control unit turns on and off the first output transistor and the second output transistor by switching a connection condition of the first switching element and the second switching element based on the output voltage of the input-output unit.

4. The reference voltage generating circuit according to claim 2, wherein the first switching element is a transistor of a first conductive type and the second switching element is a transistor of a second conductive type.

5. The reference current generating circuit according to claim 1, wherein the bias voltage generating unit includes:

a third transistor of the first conductive type that transforms the reference voltage to a current;

a resistor that is connected to an output of the third transistor; and an error amplifier having an output that is connected to a control terminal of the third transistor and that compares the reference voltage and the output voltage of the third transistor, wherein the control terminal of the third transistor is connected to the control terminal of the first transistor and the second transistor is diode-connected to the output terminal of the first transistor, and the first transistor outputs the reference current as a current flows to an output terminal of the third transistor.

6. The reference current circuit according to claim 1, wherein the bias voltage generating unit includes:

a first resistor that is connected to an output terminal of the first transistor;

a first error amplifier having an output terminal that is connected to the control terminal of the first transistor and that compares the reference voltage and the output voltage of the first transistor;

a second resistor that is connected to an output of the second transistor; and a second error amplifier that is connected to the control terminal of the second transistor and compares the reference voltage and an output voltage of the second transistor.

7. A reference current generating circuit comprising:

a reference voltage generating unit that generates a reference voltage;

a bias voltage generating unit that includes a first transistor of a first conductive type and a second transistor of a second conductive type that each output a reference current based on the reference voltage and generate a first bias voltage and a second bias voltage, respectively;

a first output transistor of a first conductive type that outputs a current corresponding to a reference current when the first bias voltage is supplied to a control terminal of the first output transistor:

a second output transistor of a second conductive type that outputs a current corresponding to a reference current when the second bias voltage is supplied to a control terminal of the second output transistor;

an input-output unit in which one terminal thereof is connected between an output terminal of the first output transistor and an input terminal of the second output transistor and the other terminal is connected to a load circuit, the input-output unit supplying current from the first output transistor to the load circuit or supplying current from the load circuit to the second output transistor; and a switching control unit that outputs a control signal to the input-output unit to turn on or off the first output transistor and the second output transistor based on voltage of an output from the input-output unit, wherein the input-output unit comprises:

a first switching element that is connected between an output terminal of the first output transistor and the input-output unit and that switches a connection of the output terminal of the first output transistor and the input-output unit; and a second switching element that is connected between an output terminal of the second output transistor and the input-output unit and that switches a connection of the output terminal of the second output transistor and the input-output unit, wherein the switching control unit turns on and off the first output transistor and the second output transistor by switching a connection condition of the first switching element and the second switching element based on the output voltage of the input-output unit, and wherein the reference current generating circuit comprises plural sets of the first output transistors, the second output transistor, the first switching element and the second switching element, and further comprising:

a reverse multiplexer that is connected to the first switching element and the second switching element of each of the sets; and a multiplexer that is connected to an output of each of the sets.

* * * * *